(12) United States Patent
Sharma et al.

(10) Patent No.: US 10,109,718 B2
(45) Date of Patent: Oct. 23, 2018

(54) METHOD FOR MANUFACTURING A SEMICONDUCTOR DEVICE

(71) Applicant: Semiconductor Components Industries, LLC, Phoenix, AZ (US)

(72) Inventors: Umesh Sharma, San Jose, CA (US); Harry Yue Gee, Santa Clara, CA (US); Der Min Liou, San Jose, CA (US); David D Marreiro, Oakland, CA (US); Sudhama C Shastri, Phoenix, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 402 days.

(21) Appl. No.: 14/267,796

(22) Filed: May 1, 2014

(65) Prior Publication Data
US 2014/0242771 A1    Aug. 28, 2014

Related U.S. Application Data

(62) Division of application No. 12/896,390, filed on Oct. 1, 2010, now abandoned.

(51) Int. Cl.
*H01L 27/02*      (2006.01)
*H01L 29/66*      (2006.01)
(Continued)

(52) U.S. Cl.
CPC ........ *H01L 29/66106* (2013.01); *H01L 24/05* (2013.01); *H01L 27/0255* (2013.01); *H01L 29/866* (2013.01); *H01L 29/8611* (2013.01); *H01L 2224/04042* (2013.01); *H01L 2224/05552* (2013.01); *H01L 2224/05556* (2013.01); *H01L 2224/0603* (2013.01); *H01L 2224/48091* (2013.01); *H01L 2224/48137* (2013.01);
(Continued)

(58) Field of Classification Search
USPC ................. 257/529, 773, E21.409, E27.033; 438/237, 289, 681
See application file for complete search history.

(56) References Cited

U.S. PATENT DOCUMENTS

| 6,704,180 B2 | 3/2004 | Tyler et al. |
| 7,361,942 B1 | 4/2008 | Matteson et al. |

(Continued)

FOREIGN PATENT DOCUMENTS

JP    2006-237518 A    9/2006

OTHER PUBLICATIONS

Slides from presentation dated Apr. 2010. Images on slides include views of parts from Semtech Corp. having part Nos. RClamp3304N, TClamp0602, and RClamp0502B.
(Continued)

*Primary Examiner* — Ori Nadav
*Assistant Examiner* — Vernon P Webb
(74) *Attorney, Agent, or Firm* — Rennie William Dover

(57) ABSTRACT

A semiconductor component and a method for manufacturing the semiconductor component, wherein the semiconductor component includes a transient voltage suppression structure that includes at least two diodes and a Zener diode. In accordance with embodiments, a semiconductor material is provided that includes an epitaxial layer. The at least two diodes and the Zener diode are created at the surface of the epitaxial layer, where the at least two diodes may be adjacent to the Zener diode.

6 Claims, 31 Drawing Sheets

(51) Int. Cl.
*H01L 29/86* (2006.01)
*H01L 29/861* (2006.01)
*H01L 29/866* (2006.01)
*H01L 23/00* (2006.01)

(52) U.S. Cl.
CPC ............... *H01L 2224/48247* (2013.01); *H01L 2224/48472* (2013.01); *H01L 2924/12035* (2013.01); *H01L 2924/1305* (2013.01); *H01L 2924/13091* (2013.01); *H01L 2924/15747* (2013.01)

(56) References Cited

U.S. PATENT DOCUMENTS

| | | | |
|---|---|---|---|
| 7,955,941 | B2 | 6/2011 | Etter et al. |
| 7,999,357 | B1 * | 8/2011 | Chan ................... H01L 27/0255 257/653 |
| 2003/0202300 | A1 | 10/2003 | Tyler et al. |
| 2009/0032906 | A1 | 2/2009 | Ostermann et al. |
| 2010/0060349 | A1 * | 3/2010 | Etter ................... H01L 27/0255 327/552 |

OTHER PUBLICATIONS

Datasheet from California Micro Devices from Issue X-1 having part No. CM1771, titled "1-Channel ESD Protector," Sep. 4, 2009.
Datasheet from Semtech Corp. for part No. RClamp0502BA, titled "Ultra-Low Capacitance TVS for ESD and COE Protection," Revision Apr. 19, 2010.
Datasheet from Semtech Corp. for part No. TClamp0602N, titled "Low Capacitance TVS for Ethernet and Telecom Interfaces," Revision May 23, 2007.
Datasheet from on Semiconductor for part No. NUP4105MU, titled Low Capacitance ESD Protection Array for High Speed Data Lines Protection, Apr. 2009-Rev. 1, Publication Order No. NUP4105MU/D.

* cited by examiner

METHOD FOR MANUFACTURING A SEMICONDUCTOR DEVICE

The present application is a division application of U.S. patent application Ser. No. 12/896,390 filed on Oct. 1, 2010, by Umesh Sharma et al., titled "ESD Device and Method" which is hereby incorporated by reference in its entirety, and priority thereto for common subject matter is hereby claimed.

BACKGROUND

The present invention relates, in general, to electronics and, more particularly, to semiconductor components and methods of forming semiconductor components.

In the past, the semiconductor industry used various methods and structures to form electrostatic discharge (ESD) protection devices. According to one international specification, the International Electrotechnical Commission (IEC) specification commonly referred to as IEC 61000-4-2 (level 2), it is desirable for an ESD device to respond to a high input voltage and current within approximately 1 nanosecond (the IEC has an address at 3, rue de Varembe, 1211 Geneve 20, Switzerland).

Some of the prior ESD devices used a Zener diode and a P-N junction diode to attempt to provide ESD protection. In general, the prior ESD devices had to trade off low capacitance against having a sharp breakdown voltage characteristic. The sharp breakdown voltage characteristic was needed to provide a low clamp voltage for the ESD device. In most cases, the device structures had a high capacitance, generally greater than about one to six (1-6) picoFarads. The high capacitance limited the response time of the ESD device. Some prior ESD devices operated in a punch-through mode which required the devices to have a very thin and accurately controlled epitaxial layer, generally less than about 2 microns thick, and required a low doping in the epitaxial layer. These structures generally made it difficult to accurately control the clamping voltage of the ESD device and especially difficult to control low clamping voltages, such as voltages of less than about ten volts (10 V). One example of such an ESD device was disclosed in U.S. Pat. No. 5,880,511 which issued on Mar. 9, 1999 to Bin Yu et al. Another ESD device used a body region of a vertical MOS transistor to form a Zener diode at an interface with an underlying epitaxial layer. The doping profiles and depths used for the ESD device resulted in a high capacitance and a slow response time. Additionally, it was difficult to control the light doping levels in the thin layers which made it difficult to control the breakdown voltage of the ESD device. An example of such an ESD device was disclosed in United States patent publication No. 2007/0073807 of inventor Madhur Bobde which was published on Mar. 29, 2007.

Accordingly, it would be advantageous to have an ESD protection device that has a low capacitance, that has a fast response time, that reacts to both a positive and a negative ESD event, that has a well controlled clamp voltage, that is easy to control in manufacturing, and that has a clamp voltage that can be controlled over a range of voltages from a low voltage to a high voltage. It would be of further advantage for the method and circuit to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
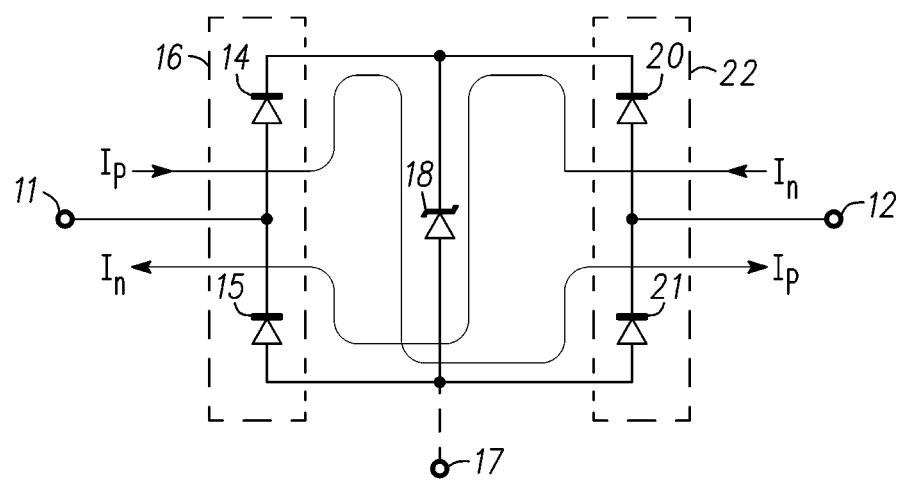
FIG. 1 schematically illustrates an embodiment of a portion of a circuit representation of an ESD protection device in accordance with an embodiment of the present invention.

For simplicity and clarity of the illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain N-channel or P-Channel devices, or certain N-type of P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately or substantially means that a value of element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION

The present description includes, among other features, a semiconductor component that includes a transient voltage suppression structure and a method for manufacturing the semiconductor component. In accordance with one aspect, a semiconductor material is provided that has a surface and a first doped region of a first conductivity type that extends from a first portion the surface into a portion of the semiconductor material. Another doped region of a second conductivity type extends from another portion of the surface into another portion of the semiconductor material. A plurality of electrical conductors is arranged in a radial array on the surface, wherein each electrical conductor has first and second ends, the first end of each electrical conductor of the plurality of electrical conductors proximal to the first doped region and the second end of each electrical conductor of the plurality of electrical conductors distal from the first doped region. The plurality of conductors may include at least first, second, and third electrical conductors, wherein the second electrical conductor is between the first and third electrical conductors, and wherein a center-to-center distance between the first ends of the first and second electrical conductors is substantially the same as a center-to-center distance between the first ends of the second and third electrical conductors. Because the electrical conductors or fingers are arranged in a radial array, most of the fingers contribute to a surge current during an electrostatic discharge event, which improves the surge current to capacitance ratio.

In accordance with another aspect, a semiconductor material is provided that has a first conductivity type and a surface. An isolation structure is formed in a portion of the semiconductor material, wherein the isolation structure extends from the surface into the semiconductor material. A diode is formed in the isolation structure. By way of example, the diode is a top diode of a transient voltage suppression device that includes top and bottom diodes. Another isolation structure is formed in another portion of the semiconductor material and extends from the surface into the semiconductor material. A diode is formed in this isolation structure that may be a bottom diode of a transient voltage suppression device. A Zener isolation structure is formed in the semiconductor material that extends from the surface into the semiconductor material. A Zener diode is formed from the Zener isolation structure. An advantage with this embodiment is that the top and bottom diodes are formed adjacent the Zener diode and the top and bottom diodes and the Zener diodes are formed at the surface of the semiconductor material. This configuration lowers the capacitance of the semiconductor components and improves the current surge-to-capacitance ratio.

FIG. 1 schematically illustrates an embodiment of a portion of a semiconductor component such as, for example, an ESD protection device or ESD device 10 that has a low capacitance and a fast response time. Device 10 includes two terminals, a terminal 11 and a terminal 12, and is configured to provide bidirectional ESD protection between terminals 11 and 12. Either of terminals 11 and 12 can be an input terminal or an output terminal. The output terminal usually is connected to another element (not shown) that is to be protected by device 10. For example, terminal 12 may be used as the output terminal and connected to the high side of a regulated power supply, e.g., a 5V supply. Device 10 is configured to have a low capacitance between terminals 11 and 12. Device 10 also is formed to limit the maximum voltage that is formed between terminals 11 and 12 to the clamp voltage of device 10. Furthermore, device 10 is formed to have a sharp knee or sharp breakdown voltage characteristic that assists in accurately controlling the value of the clamp voltage. The low capacitance assists in providing device 10 with a fast response time. Device 10 includes a plurality of steering diode channels that includes a steering diode channel 16 and a steering diode channel 22. Channel 16 includes a steering diode 14 that has an anode commonly connected to terminal 11 and to a cathode of a steering diode 15. Channel 22 includes a steering diode 20 that has an anode commonly connected to terminal 12 and to a cathode of a steering diode 21. Diodes 14, 15, 20, and 21 are formed as P-N junction diodes that have a low capacitance. A Zener diode 18 is connected in parallel with each of channels 16 and 22. Zener diode 18 has an anode connected to the anodes of diodes 15 and 21 and to a terminal 17, and a cathode connected to the cathodes of diodes 14 and 20.

In normal operation, device 10 is biased to a normal operating voltage, such as a voltage that is between about one volt (1V) and the Zener voltage of diode 18, such as by applying about one volt (1V) to terminal 11 and a ground reference voltage to terminal 12. Because of the hereinafter described characteristics of device 10, the capacitance of device 10 remains low as the voltage between terminals 11 and 12 varies over this normal operating voltage. However, the capacitance of an ESD device is customarily specified with zero volts applied across the device. This zero voltage condition is normally referred to as a zero bias condition. As will be seen further hereinafter, at this zero bias condition the hereinafter described low capacitance features of device 10 forms very low capacitance values for diodes 14, 15, 20, and 21. Since there are two parallel paths between terminals 11 and 12, the capacitance value of each path is the additive product of the capacitances in each path. The first path includes the capacitances of diodes 14, 18, and 21 in series. Since the capacitance of capacitors in series is smaller than that of the smallest capacitor, then the capacitance of the first path is smaller than the capacitance of either of diodes 14, 18, or 21. Device 10 is formed so that the zero bias capacitances of diodes 14 and 21 are very small as will be seen further hereinafter. Similarly, the capacitance of the second path, that includes diodes 20, 18, and 15, is also very small. The overall additive value of the two paths forms a small zero bias capacitance for device 10.

If a positive ESD event is received on terminal 11, terminal 11 is forced to a large positive voltage relative to terminal 12. The large positive voltage forward biases diodes 14 and 21 and reverse biases Zener diode 18 in addition to diodes 15 and 20. As the voltage between terminals 11 and 12 reaches the positive threshold voltage of device 10 (the forward voltage of diodes 14 and 21 plus the Zener voltage of Zener diode 18) a positive current (Ip) flows from terminal 11 through diode 14 to Zener diode 18, and through Zener diode 18 and diode 21 to terminal 12. The Zener voltage of Zener diode 18 clamps the maximum voltage formed between terminals 11 and 12 to approximately the Zener voltage of Zener diode 18 (plus the forward voltage of diodes 14 and 21). If a negative ESD event is received on terminal 11, terminal 11 is forced to a large negative voltage relative to terminal 12. The large negative voltage forward biases diodes 20 and 15, and reverse biases Zener diode 18 in addition to diodes 14 and 21. As the voltage between terminals 11 and 12 reaches the negative threshold voltage of device 10 (the forward voltage of diodes 20 and 15 plus the Zener voltage of Zener diode 18) a negative current (In) flows from terminal 12 through diode 20 to diode 18, and through Zener diode 18 and diode 15 to terminal 11. The sharp knee of Zener diode 18 causes it to rapidly clamp the maximum voltage between terminals 11 and 12 to the Zener voltage of diode Zener 18 (plus the forward voltage of diodes 15 and 20).

Figure 2:
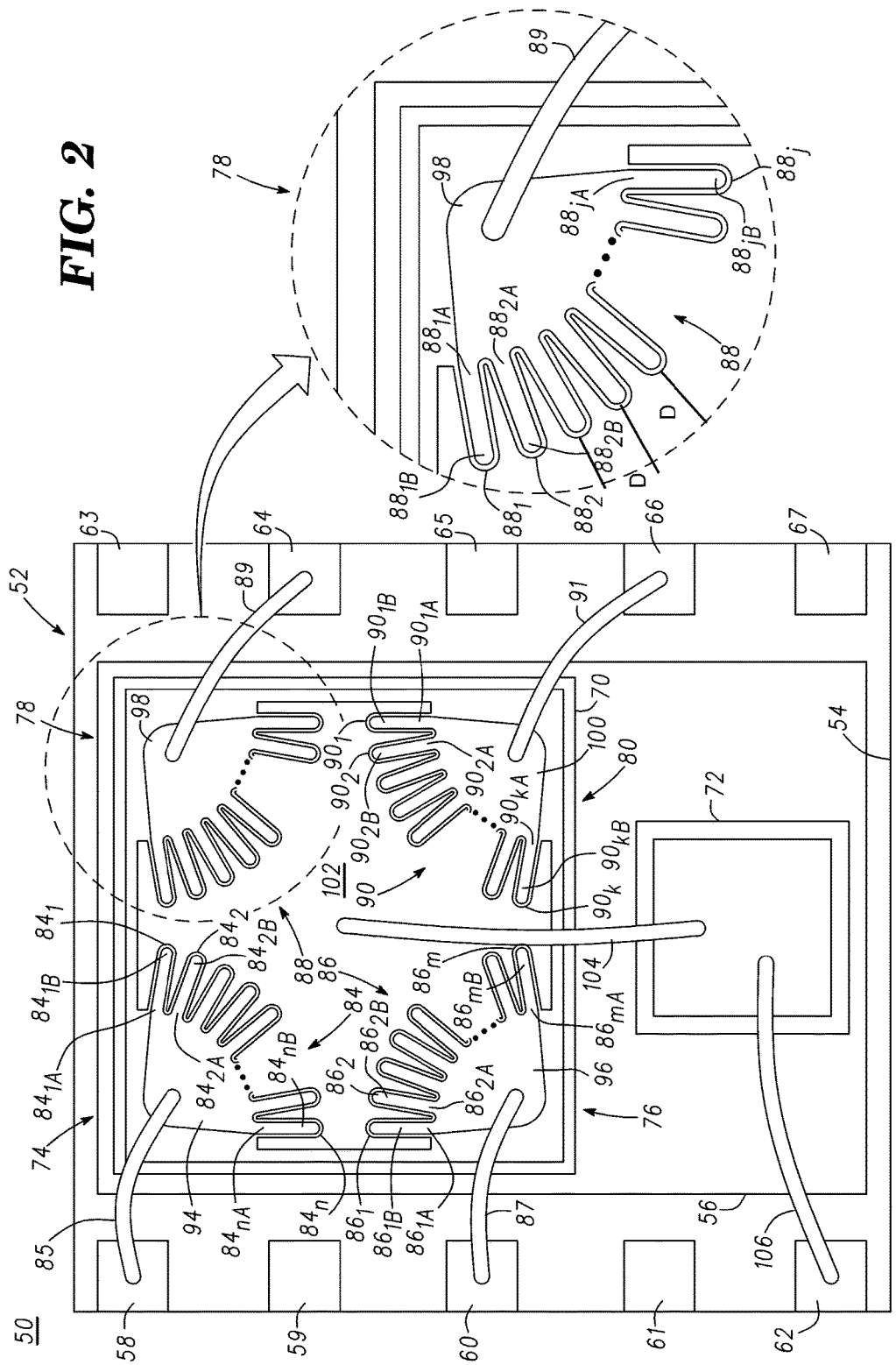
FIG. 2 is a plan view of a portion of an ESD protection device in accordance with another embodiment of the present invention.

FIG. 2 is a plan view of a portion 52 of an ESD device 50 in accordance with another embodiment of the present invention. More particularly, FIG. 2 illustrates a support structure 54 having a semiconductor chip receiving area 56 and a plurality of interconnect leads 58, 59, 60, 61, 62, 63, 64, 65, 66, and 67. By way of example, support structure 54 is a copper leadframe in which semiconductor chip receiving area 56 may be referred to as a leadframe flag or paddle and interconnect leads 58-67 may be referred to as leadframe leads. It should be understood that support structure 54 is not limited to being a copper leadframe but may be a printed circuit board, a leadframe comprising an electrically conductive material, or the like. Semiconductor chips 70 and 72 are coupled to semiconductor chip receiving area 56. Semiconductor chips 70 and 72 are coupled to leadframe flag 56 through an electrically conductive die attach material (not shown). Techniques for coupling a semiconductor chip to a leadframe flag are known to those skilled in the art.

Still referring to FIG. 2, semiconductor chip 70 includes four regions 74, 76, 78, and 80, where each region has sets of diode fingers arranged in a radial array or pattern. By way of example, a set of diode fingers 84 is formed in region 74, a set of diode fingers 86 is formed in region 76, a set of diode fingers 88 is formed in region 78, and a set of diode fingers 90 is formed in region 80. Each set of diode fingers comprises an electrically conductive material having an end proximal to a node common to a top diode and a bottom diode and an end distal from the node that is common to the top and bottom diodes. By way of example, semiconductor chip 72 includes a Zener diode, which is connected in parallel to Zener diode 18 (shown in FIG. 1) that is integrated in semiconductor chip 70. It should be noted that FIG. 1 illustrates a configuration having a region in which diode 14 is a top diode, diode 15 is a bottom diode and the node between the cathode of bottom diode 15 and the anode of top diode 14 is the common node. FIG. 1 further illustrates a region in which diode 20 is a top diode, diode 21 is a bottom diode and the node between the cathode of bottom diode 21 and the anode of top diode 20 is the common node. It should be further noted that the configuration shown in FIG. 1 may be formed on a semiconductor chip having two regions, whereas semiconductor chip 70 has four regions, where a top diode and a bottom diode are formed in each region 74, 76, 78, and 80 for a total of four top diodes and four bottom diodes. A semiconductor chip is not limited to the number of regions it has.

Diode fingers 84 include diode fingers $84_1, 84_2 \ldots 84_n$, where diode finger $84_1$ has an end $84_{1A}$ proximal to the common node and an end $84_{1B}$ distal from the common node; diode finger $84_2$ has an end $84_{2A}$ proximal to the common node and an end $84_{2B}$ distal from the common node; diode finger $84_n$ has an end $84_{nA}$ proximal to the common node and an end $84_{nB}$ distal from the common node. Diode fingers $84_1, 84_2 \ldots, 84_n$ are arranged so that distal ends of adjacent diode fingers are equidistant from each other or substantially equidistant from each other. More particularly, the center-to-center distance between ends $84_{1B}$ and $84_{2B}$ is the same as or substantially the same as the center-to-center distance between ends $84_{(n-1)B}$ and $84_{nB}$.

Diode fingers 86 include diode fingers $86_1, 86_2 \ldots, 86_m$, where diode finger $86_1$ has an end $86_{1A}$ proximal to the common node and an end $86_{1B}$ distal from the common node; diode finger $86_2$ has an end $86_{2A}$ proximal to the common node and an end $86_{2B}$ distal from the common node; diode finger $86_n$ has an end $86_{nA}$ proximal to the common node and an end $86_{nB}$ distal from the common node. Diode fingers $86_1, 86_2 \ldots, 86_n$ are arranged so that distal ends of adjacent diode fingers are equidistant from each other or substantially equidistant from each other. More particularly, the center-to-center distance between ends $86_{1B}$ and $86_{2B}$ is the same as or substantially the same as the center-to-center distance between ends $86_{(m-1)B}$ and $86_{mB}$.

Diode fingers 88 include diode fingers $88_1, 88_2 \ldots, 88_j$, where diode finger $88_1$ has an end $88_{1A}$ proximal to the common node and an end $88_{1B}$ distal from the common node; diode finger $88_2$ has an end $88_{2A}$ proximal to the common node and an end $88_{2B}$ distal from the common node; diode finger $88_n$ has an end $88_{nA}$ proximal to the common node and an end $88_{nB}$ distal from the common node. Diode fingers $88_1, 88_2 \ldots, 88_n$ are arranged so that distal ends of adjacent diode fingers are equidistant from each other or substantially equidistant from each other. More particularly, the center-to-center distance between ends $88_{1B}$ and $88_{2B}$ is the same as or substantially the same as the center-to-center distance between ends $88_{(j-1)B}$ and $88_{jB}$.

Diode fingers 90 include diode fingers $90_1, 90_2 \ldots, 90_k$, where diode finger $90_1$ has an end $90_{1A}$ proximal to the common node and an end $90_{1B}$ distal from the common node; diode finger $90_2$ has an end $90_{2A}$ proximal to the common node and an end $90_{2B}$ distal from the common node; diode finger $90_n$ has an end $90_{nA}$ proximal to the common node and an end $90_{nB}$ distal from the common node. Diode fingers $90_1, 90_2 \ldots, 90_n$ are arranged so that distal ends of adjacent diode fingers are equidistant from each other or substantially equidistant from each other. More particularly, the center-to-center distance between end $90_{1B}$ and $90_{2B}$ is the same as or substantially the same as the center-to-center distance between ends $90_{(k-1)B}$ and $90_{kB}$.

The variables n, m, j, and k represent integers that may be greater than or equal to zero and that may be equal to each other or different from each other. Although the number of diode fingers in each region has been described as being at least two, this is not a limitation of the present invention. There may be a single diode finger formed in one or more of the regions.

Portion 94 of region 74 that is in the interior portion of the arc formed by the radial array of diode fingers 84 is connected to interconnect lead 58 by a wire bond 85. Portion 96 of region 76 that is in the interior portion of the arc formed by the radial array of diode fingers 86 is connected to interconnect lead 60 by a wire bond 87. Portion 98 of region 88 that is in the interior portion of the arc formed by the radial array of diode fingers 88 is connected to interconnect lead 64 by a wire bond 89. Portion 100 of region 90 that is in the interior portion of the arc formed by the radial array of diode fingers 90 is connected to interconnect lead 66 by a wire bond 91. The portion 102 of semiconductor chip 70 that is exterior to the arcs formed by the radial arrays of diode fingers 84, 86, 88, and 90 is connected to semiconductor chip 72 by a wire bond 104. Semiconductor chip 72 is connected to interconnect lead 62 by a wire bond 106. By way of example, semiconductor chip 72 includes a Zener diode, where the surface of semiconductor chip 72 that is not adjacent to chip receiving area 56, i.e., the surface of semiconductor chip 72 to which wire bonds 104 and 106 are bonded serve as the cathode of the Zener diode integrated into semiconductor chip 72.

Figure 3:
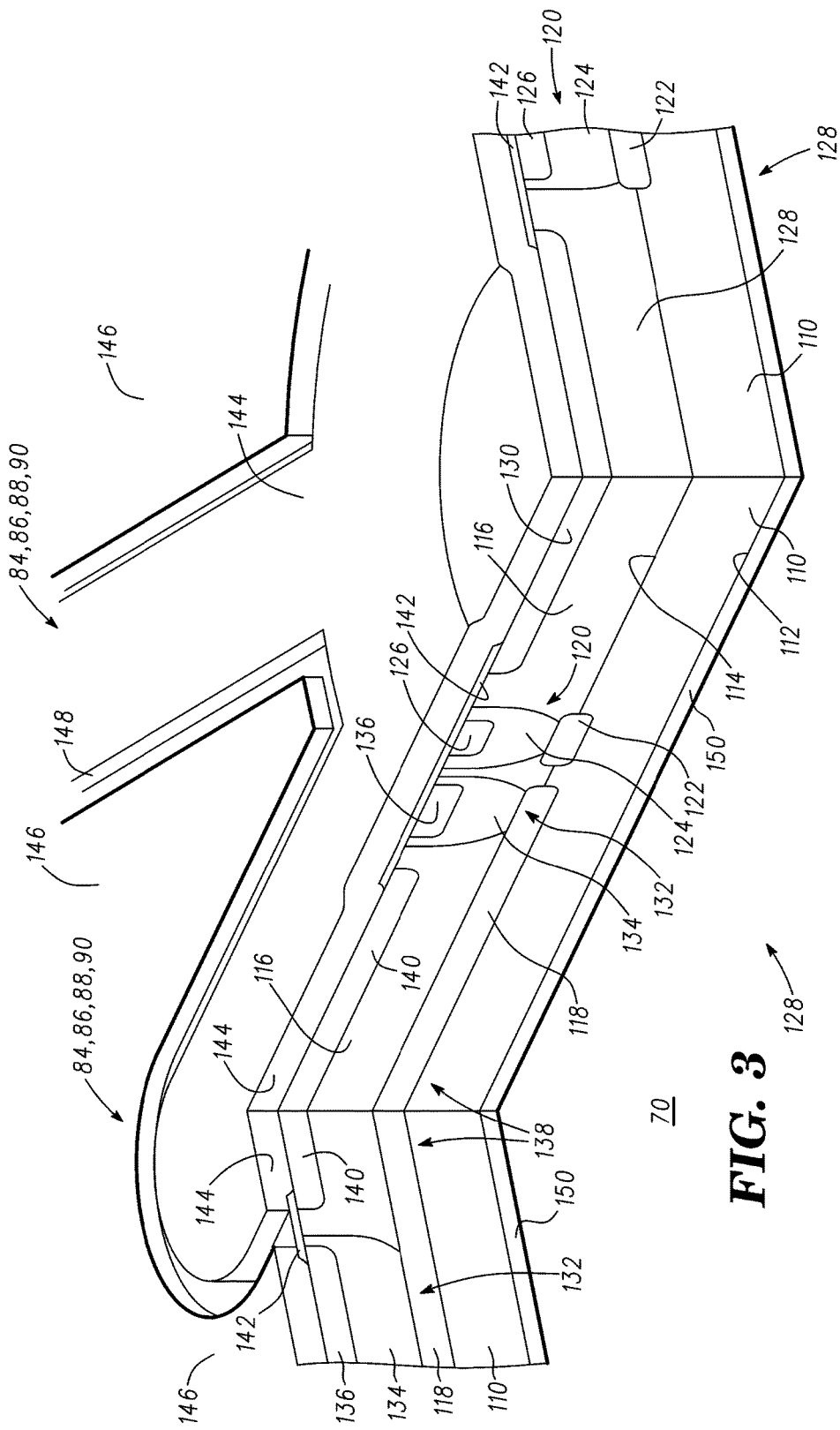
FIG. 3 is a cross-sectional cut-away view of a portion of an ESD protection device in accordance with another embodiment of the present invention.

FIG. 3 is an isometric cut-away view of a portion of semiconductor chip 70. What is shown in FIG. 3 is a semiconductor substrate 110 having surfaces 112 and 114. An epitaxial layer 116 is formed on semiconductor substrate 110. By way of example, semiconductor substrate 110 is silicon doped with an impurity material of P-type conductivity and epitaxial layer 116 is silicon doped with an impurity of N-type conductivity. A buried layer 118 of N-type conductivity is formed in portions of semiconductor substrate 110 and epitaxial layer 116. An isolation structure 120 extends through portions of epitaxial layer 116 to semiconductor substrate 110. By way of example, isolation structure 120 is comprised of a buried layer 122 of P-type conductivity that is formed in portions of semiconductor substrate 110 and epitaxial layer 116, a doped region 124 of P-type conductivity extending from the surface of epitaxial layer 116 to buried layer 122, and an enhanced doped region 126 of P-type conductivity extending from the surface of epitaxial layer 116 into doped region 124. Isolation structure 120 isolates a portion 128 of epitaxial layer 116 that serves as a cathode of a bottom diode. A doped region 130 of N-type conductivity extends from the surface of epitaxial layer 116 into portion 128.

An isolation structure 132 extends through portions of epitaxial layer 116 to semiconductor substrate 110. By way of example, isolation structure 132 is comprised of a doped region 134 of N-type conductivity extending from the surface of epitaxial layer 116 to buried layer 118, and an enhanced doped region 136 of N-type conductivity extending from the surface of epitaxial layer 116 into doped region 134. Isolation structure 132 isolates a portion 138 of epitaxial layer 116 that serves as a cathode of a top diode. A doped region 140 of P-type conductivity extends from the surface of epitaxial layer 116 into portion 138 and serves as a portion of the anode of the top diode. Oxide layers 142 are formed over the regions of epitaxial layer 116 in which isolation structures 120 and 132 are formed. A metallization system 144 is formed on portions of epitaxial layer 116, doped region 140, and oxide layers 142. Diode fingers such as, for example, diode fingers 84, 86, 88, and 90 (shown in FIG. 2) are formed from metallization system 144. In addition, portions 146 of metallization system 144 form a cathode of a Zener diode. Portions 146 and fingers 84, 86, 88, and 90 are electrically isolated from each other by a trench 148. Typically, a passivation layer is formed over metallization system 144. However, for the sake of clarity this layer is absent.

A metallization system 150 is formed on or from surface 112 of semiconductor substrate 110 and may serve as an anode of the bottom diodes.

Figure 4:
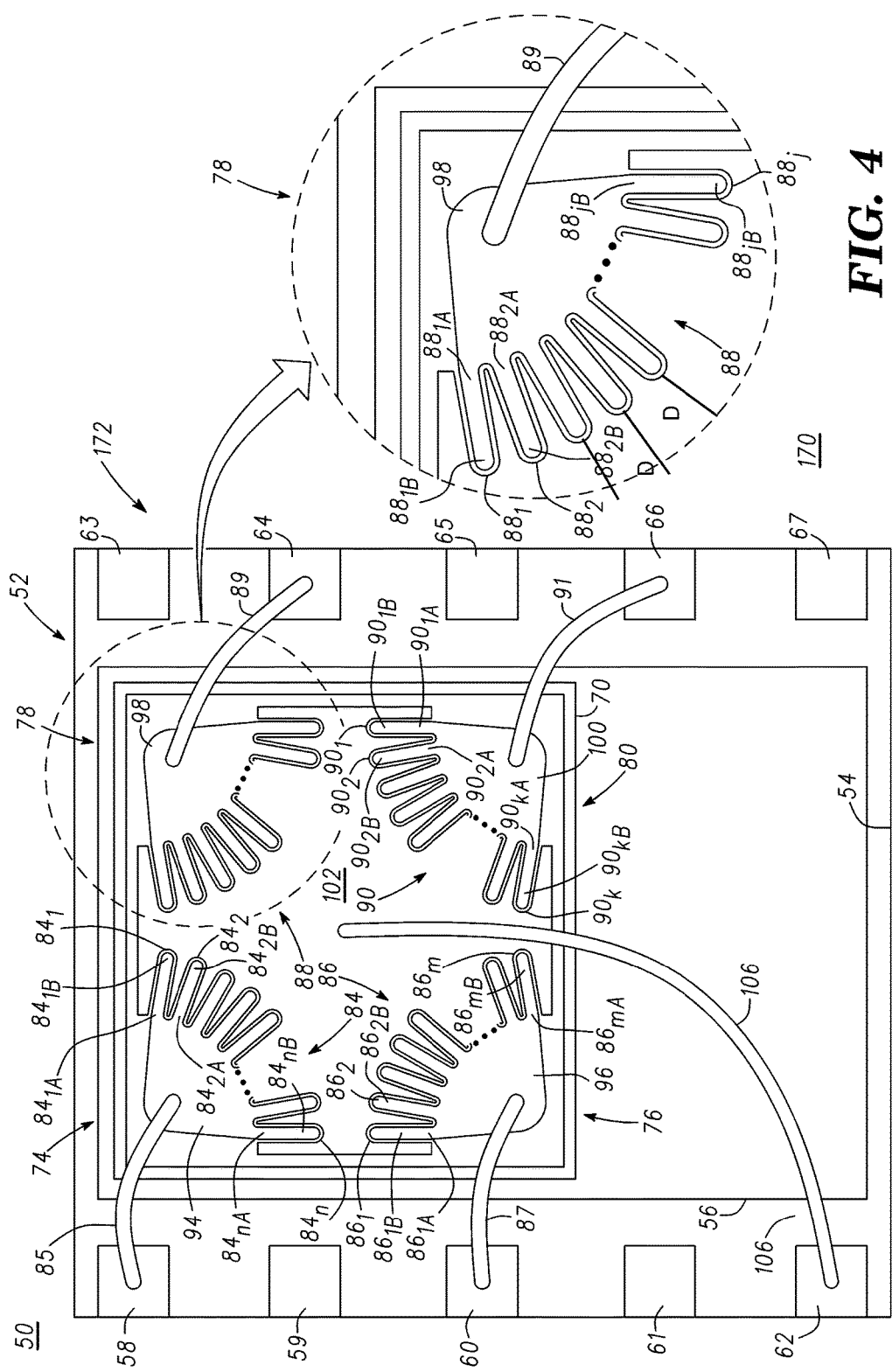
FIG. 4 is a plan view of a portion of an ESD protection device in accordance with another embodiment of the present invention.

FIG. 4 is a plan view of a portion 172 of an ESD device 170 in accordance with another embodiment of the present invention. ESD device 170 is similar to ESD device 50 except semiconductor chip 72 is absent. Accordingly, the portion 102 of semiconductor chip 70 that is exterior to the arcs formed by the radial arrays of diode fingers 84, 86, 88, and 90 is connected to interconnect lead 62 by a wire bond 174.

Figure 5:
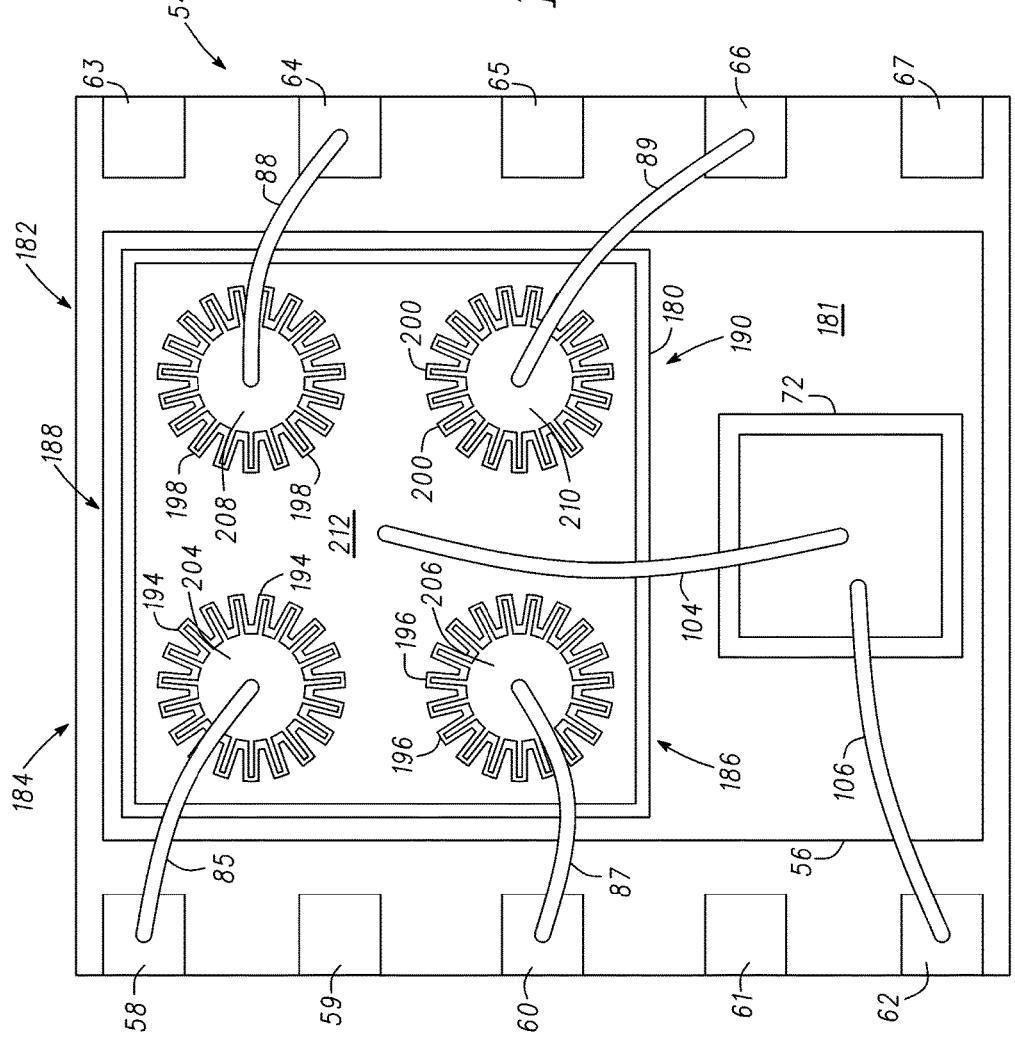
FIG. 5 is a plan view of a portion of an ESD protection device in accordance with another embodiment of the present invention.

FIG. 5 is a plan view of a portion 182 of an ESD device 181 formed from a semiconductor chip 180 in accordance with another embodiment of the present invention. More particularly, FIG. 5 illustrates a support structure 54 having a semiconductor chip receiving area 56 and a plurality of interconnect leads 58, 59, 60, 61, 62, 63, 64, 65, 66, and 67. Semiconductor support structure 54 was described with reference to FIG. 2. Semiconductor chip 180 includes four regions 184, 186, 188, and 190 each region having a set of diode fingers arranged in a circular array or pattern. By way of example, a set of diode fingers 194 is formed in region 184, a set of diode fingers 196 is formed in region 186, a set of diode fingers 198 is formed in region 188, and a set of diode fingers 200 is formed in region 190. Each set of diode fingers comprises an electrically conductive material having an end proximal to a node common to a top diode and a bottom diode and an end distal from the node that is common to the top and bottom diodes. As discussed above, FIG. 1 illustrates a configuration having a region in which diode 14 is a top diode, diode 15 is a bottom diode and the node between the cathode of bottom diode 15 and the anode of top diode 14 is the common node. FIG. 1 further illustrates a region in which diode 20 is a top diode, diode 21 is a bottom diode and the node between the cathode of bottom diode 21 and the anode of top diode 20 is the common node. It should be further noted that the configuration shown in FIG. 1 may be formed on a semiconductor chip having two regions, whereas semiconductor chip 180 has four regions, where a top diode and a bottom diode are formed in each region 184, 186, 188, and 190 for a total of four top diodes and four bottom diodes. A semiconductor chip is not limited to the number of regions it has.

The portion 204 of region 184 that is in the interior portion of the circular array of diode fingers 194 is connected to interconnect lead 58 by a wire bond 85. The portion 206 of region 186 that is in the interior portion of the circular array of diode fingers 196 is connected to interconnect lead 60 by a wire bond 87. The portion 208 of region 188 that is in the interior portion of the circular array of diode fingers 198 is connected to interconnect lead 63 by a wire bond 88. The portion 210 of region 190 that is in the interior portion of the circular array of diode fingers 200 is connected to interconnect lead 65 by a wire bond 89. The region 212 of semiconductor chip 180 that is exterior to the circular arrays of diode fingers 194, 196, 198, and 200 is connected to semiconductor chip 72 by a wire bond 104. Semiconductor chip 72 is connected to interconnect lead 62 by a wire bond 106. As discussed above, semiconductor chip 72 includes a Zener diode.

In an alternative embodiment, semiconductor chip 72 is absent from ESD device 181 and region 212 is directly connected to interconnect lead 62 through a wire bond. Although the number of diode fingers in each region has been described as being at least two, this is not a limitation of the present invention. There may be a single diode finger formed in one or more of the regions.

Figure 6:
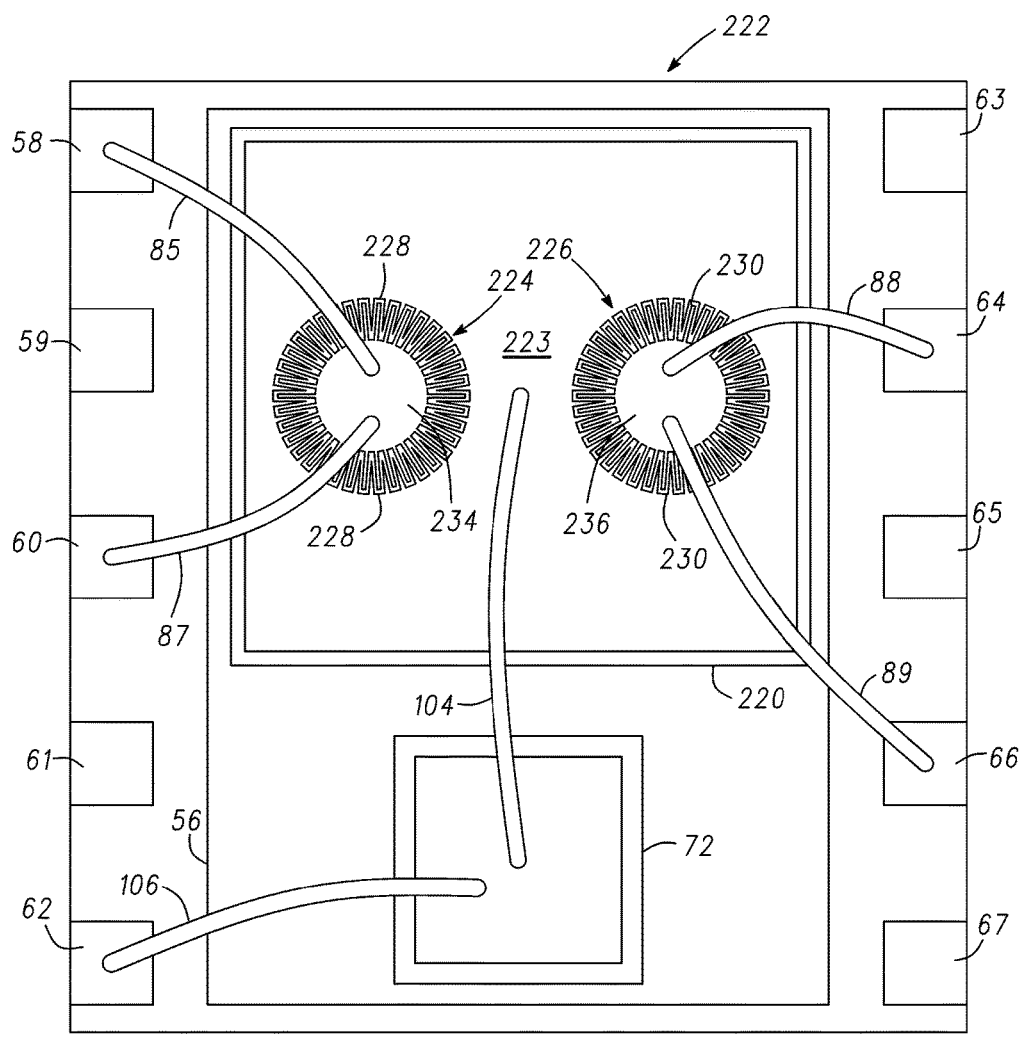
FIG. 6 is a plan view of a portion of an ESD protection device in accordance with another embodiment of the present invention.

FIG. 6 is a plan view of a portion 222 of an ESD device 221 formed from a semiconductor chip 220 in accordance with another embodiment of the present invention. More particularly, FIG. 6 illustrates a support structure 54 having a semiconductor chip receiving area 56 and a plurality of interconnect leads 58, 59, 60, 61, 62, 63, 64, 65, 66, and 67. Semiconductor support structure 54 was described with reference to FIG. 2. Semiconductor chip 220 includes a region 223 having sub-regions 224 and 226, where each sub-region 224 and 226 has sets of diode fingers arranged in a circular array or pattern. By way of example, a set of diode fingers 228 is formed in sub-region 224 and a set of diode fingers 230 is formed in sub-region 226. Each set of diode fingers comprises an electrically conductive material having an end proximal to a node common to a top diode and a bottom diode and an end distal from the node that is common to the top and bottom diodes. As discussed above, FIG. 1 illustrates a configuration having a region in which diode 14 is a top diode, diode 15 is a bottom diode and the node between the cathode of bottom diode 15 and the anode of top diode 14 is the common node. FIG. 1 further illustrates a region in which diode 20 is a top diode, diode 21 is a bottom diode and the node between the cathode of bottom diode 21 and the anode of top diode 20 is the common node.

The portion 234 of sub-region 224 that is in the interior portion of the circular array of diode fingers 228 is connected to interconnect lead 58 by a wire bond 85. The portion 236 of sub-region 226 that is in the interior portion of the circular array of diode fingers 230 is connected to interconnect lead 60 by a wire bond 87. The portion of region 223 that is exterior to the circular arrays of diode fingers 228 and 230 is connected to semiconductor chip 72 by a wire bond 104. Semiconductor chip 72 is connected to interconnect lead 62 by a wire bond 106.

In an alternative embodiment, semiconductor chip 72 is absent from ESD device 221 and region 223 is connected to interconnect lead 62 through a wire bond. Although the number of diode fingers in each region has been described as being at least two, this is not a limitation of the present invention. There may be a single diode finger formed in one or more of the regions.

Figure 7:
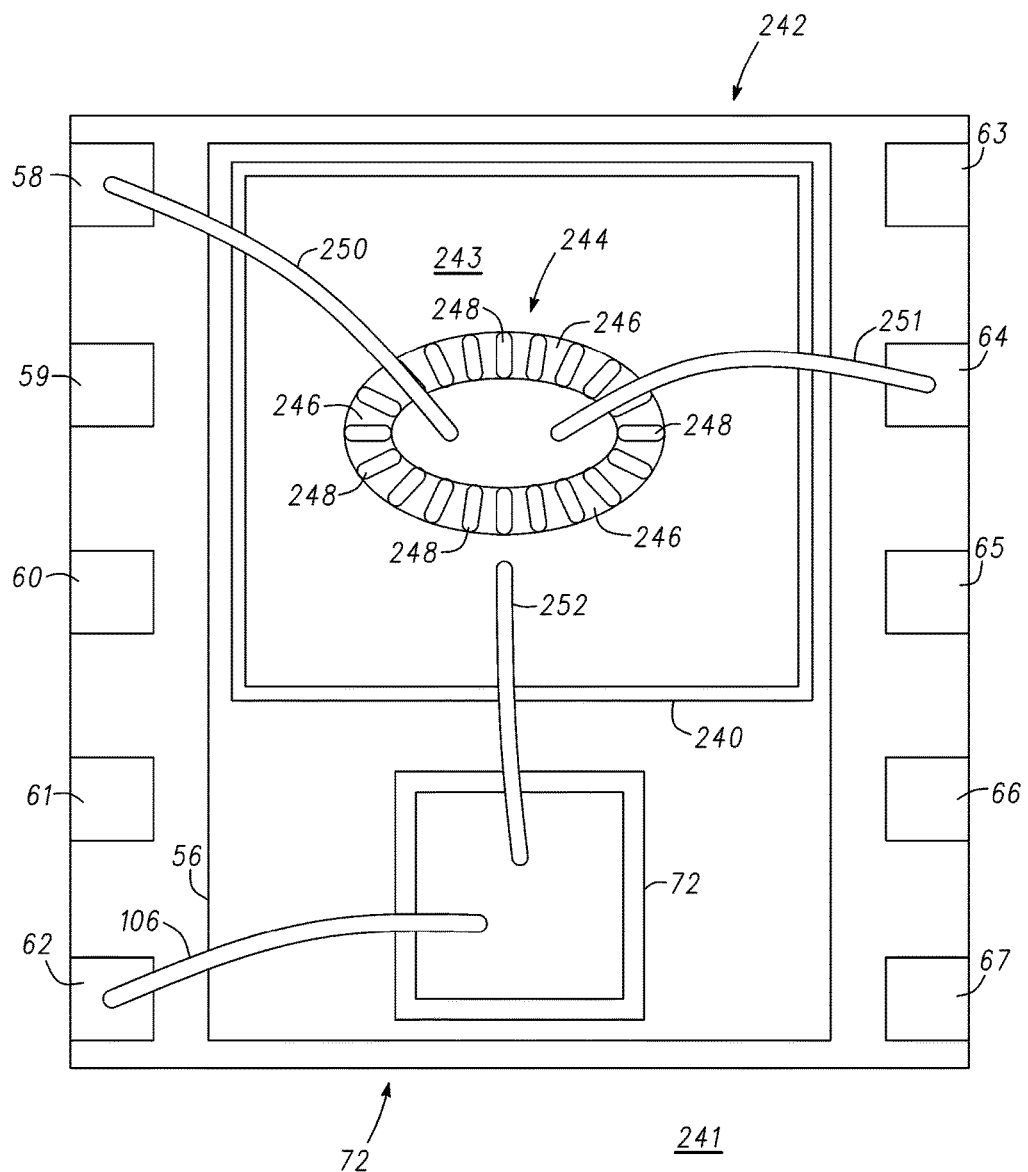
FIG. 7 is a plan view of a portion of an ESD protection device in accordance with another embodiment of the present invention.

FIG. 7 is a plan view of a portion 242 of an ESD device 241 formed from a semiconductor chip 240 in accordance with another embodiment of the present invention. More particularly, FIG. 7 illustrates a support structure 54 having a semiconductor chip receiving area 56 and a plurality of interconnect leads 58, 59, 60, 61, 62, 63, 64, 65, 66, and 67. Semiconductor support structure 54 was described with reference to FIG. 2. Semiconductor chip 240 includes regions 243, 244, and 246 where region 246 includes a set of diode fingers 248 arranged in an elliptical array or pattern that surround region 244. Each diode finger comprises an electrically conductive material having an end proximal to a node common to a top diode and a bottom diode and an end distal from the node that is common to the top and bottom diodes. The node common to the top and bottom diodes is region 244. As discussed above, FIG. 1 illustrates a configuration having a region in which diode 14 is a top diode, diode 15 is a bottom diode and the node between the cathode of bottom diode 15 and the anode of top diode 14 is the common node. FIG. 1 further illustrates a region in which diode 20 is a top diode, diode 21 is a bottom diode and the node between the cathode of bottom diode 21 and the anode of top diode 20 is the common node.

Region 244 is connected to interconnect lead 58 by a wire bond 250 and to interconnect lead 63 by a wire bond 251. Region 243 is connected to semiconductor chip 72 by a wire bond 104. Semiconductor chip 72 is connected to interconnect lead 62 by a wire bond 106.

Although the number of diode fingers in each region has been described as being at least two, this is not a limitation of the present invention. There may be a single diode finger formed in one or more of the regions.

In an alternative embodiment, semiconductor chip 72 is absent from ESD device 241 and region 243 is directly connected to interconnect lead 62 through a wire bond. Although the number of diode fingers in each region has been described as being at least two, this is not a limitation of the present invention. There may be a single diode finger formed in one or more of the regions.

Figure 8:
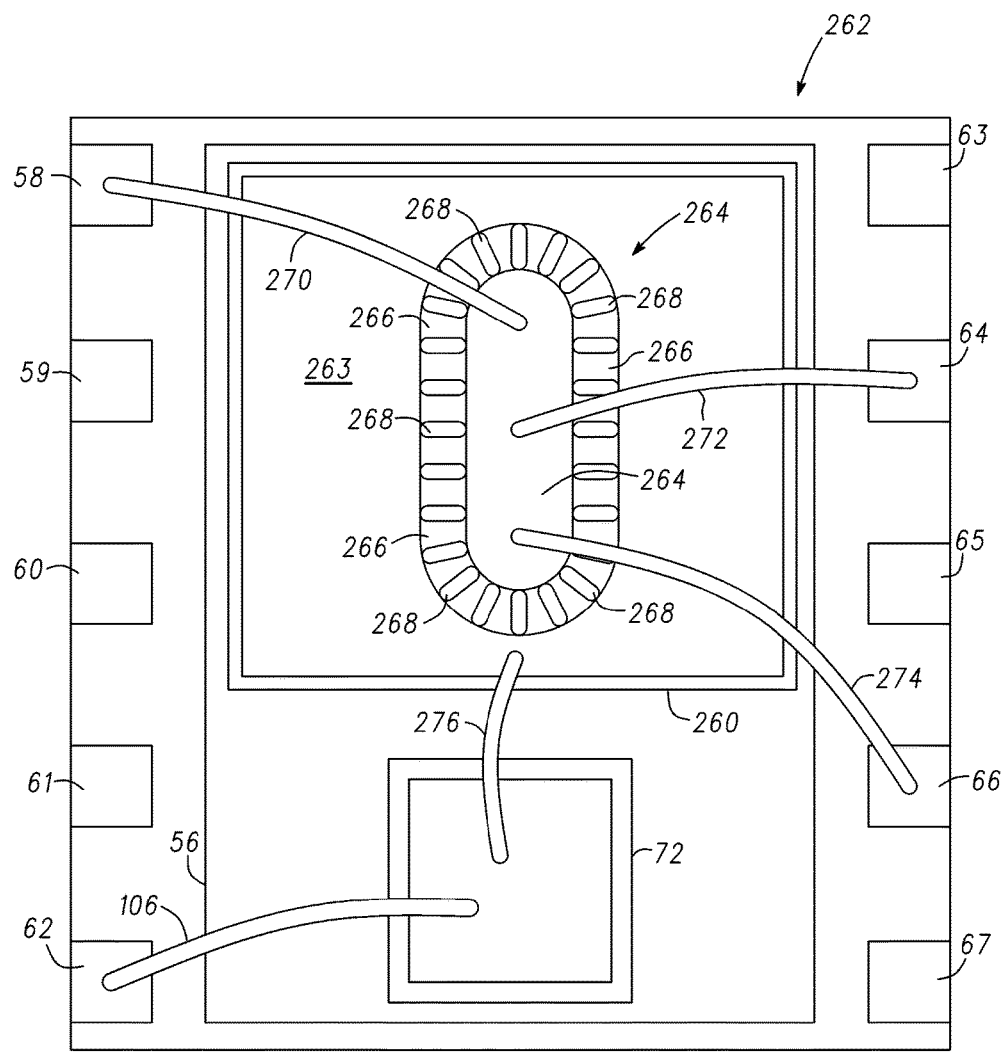
FIG. 8 is a plan view of a portion of an ESD protection device in accordance with another embodiment of the present invention.

FIG. 8 is a plan view of a portion 262 of an ESD device 261 formed from a semiconductor chip 260 in accordance with another embodiment of the present invention. More particularly, FIG. 8 illustrates a support structure 54 having a semiconductor chip receiving area 56 and a plurality of interconnect leads 58, 59, 60, 61, 62, 63, 64, 65, 66, and 67. Semiconductor support structure 54 was described with reference to FIG. 2. Semiconductor chip 260 includes regions 263, 264, and 266 where region 266 includes a set of diode fingers 268 arranged in an elliptical array or pattern that surround region 264. Each diode finger comprises an electrically conductive material having an end proximal to a node common to a top diode and a bottom diode and an end distal from the node that is common to the top and bottom diodes. The node common to the top and bottom diodes is region 264. As discussed above, FIG. 1 illustrates a configuration having a region in which diode 14 is a top diode, diode 15 is a bottom diode and the node between the cathode of bottom diode 15 and the anode of top diode 14 is the common node. FIG. 1 further illustrates a region in which diode 20 is a top diode, diode 21 is a bottom diode and the node between the cathode of bottom diode 21 and the anode of top diode 20 is the common node.

Region 264 is connected to interconnect lead 58 by a wire bond 270, to interconnect lead 63 by a wire bond 272, and to interconnect lead 66 by a wire bond 274. Region 263 is connected to semiconductor chip 72 by a wire bond 276. Semiconductor chip 72 is connected to interconnect lead 62 by a wire bond 106.

Although the number of diode fingers in each region has been described as being at least two, this is not a limitation of the present invention. There may be a single diode finger formed in one or more of the regions.

In an alternative embodiment, semiconductor chip 72 is absent from ESD device 261 and region 263 is directly connected to interconnect lead 62 through a wire bond. Although the number of diode fingers in each region has been described as being at least two, this is not a limitation of the present invention. There may be a single diode finger formed in one or more of the regions.

Although the diode fingers shown in FIGS. 2-8 are shown as being non-tapered, this is not a limitation of the present invention. For example, the diode fingers may be tapered.

Figure 9:
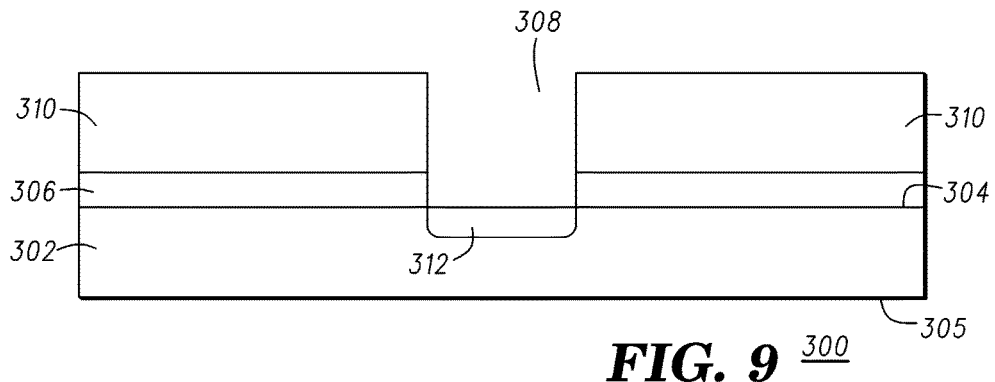
FIG. 9 is a cross-sectional view of a portion of a semiconductor component at an early stage of manufacture in accordance with another embodiment of the present invention.

FIG. 9 is a cross-sectional view of a portion of a semiconductor component 300 in accordance with another embodiment of the present invention. What is shown in FIG. 9 is a semiconductor material 302 having major surfaces 304 and 305. In accordance with an embodiment, semiconductor material 302 is silicon doped with an impurity material of P-type conductivity such as, for example, boron. By way of example, the resistivity of semiconductor material 302 ranges from about 0.001 Ohm-centimeters ($\Omega$-cm) to about 10,000 $\Omega$-cm. Although semiconductor material 302 may be a high resistivity substrate, the resistivity or dopant concentration of semiconductor material 302 is not a limitation of the present invention. Likewise, semiconductor material 302 is not limited to being silicon and its conductivity type is not limited to being P-type conductivity. It should be understood that an impurity material is also referred to as a dopant or impurity species. Other suitable materials for semiconductor material 302 include polysilicon, germanium, silicon germanium, Semiconductor-On-Insulator ("SOI") material, an epitaxial layer formed on a bulk silicon material, and the like. In addition, semiconductor material 302 can be comprised of a compound semiconductor material such as Group III-V semiconductor materials, Group II-VI semiconductor materials, etc.

A layer of dielectric material 306 having a thickness ranging from about 1,000 Angstroms (Å) to about 60,000 Å is formed on or from surface 304. In accordance with an embodiment, dielectric material 306 is formed by the decomposition of tetraethylorthosilicate ("TEOS") to form an oxide layer having a thickness of about 8,000 Å. A dielectric layer formed in this manner is typically referred to as TEOS or a TEOS layer. The type of material for dielectric layer 306 is not a limitation of the present invention. A layer of photoresist is formed on TEOS layer 306 and patterned to have at least one opening 308 that exposes a portion of TEOS layer 306. The remaining portions of the photoresist layer serve as a masking structure 310.

An opening is formed in the exposed portion of TEOS layer 306 using, for example, an anisotropic reactive ion etch. The opening exposes a portion of semiconductor material 302. An impurity material of N-type conductivity is implanted into the exposed portion of semiconductor material 302 to form a doped region 312. By way of example, the impurity material is phosphorus.

Figure 10:
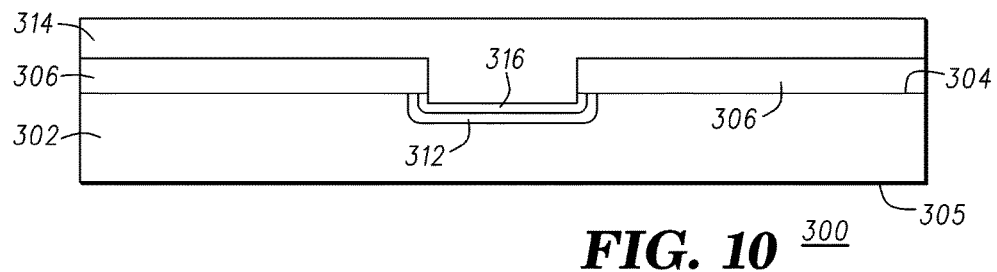
FIG. 10 is a cross-sectional view of the semiconductor component of FIG. 9 at a later stage of manufacture.

Referring now to FIG. 10, masking structure 310 is removed. A layer of antimony 314 is formed on TEOS layer 306 and on doped region 312. The impurity material of doped region 312 and the antimony of antimony layer 314 are driven into semiconductor material 302 using a diffusion furnace. The ambient within the furnace initially may be steam or oxygen and subsequently changed to nitrogen. Driving in the impurity material of doped region 312 diffuses the impurity material laterally and vertically so that doped region 312 extends further into semiconductor material 302 than when it was initially deposited. For the sake of clarity, reference character 312 is used to indicate the doped region before and after diffusion. In addition, the drive-in forms a doped region 316 that comprises antimony.

Figure 11:
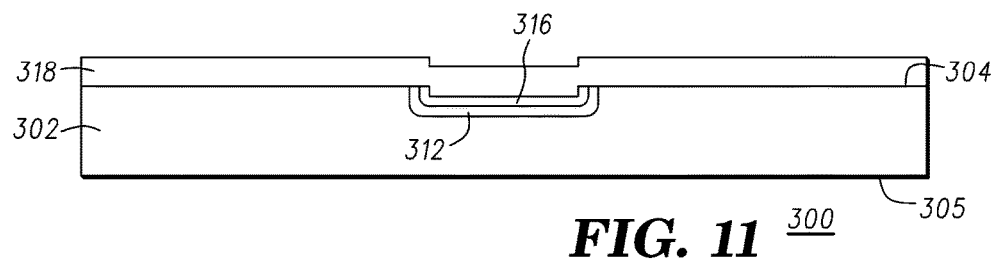
FIG. 11 is a cross-sectional view of the semiconductor component of FIG. 10 at a later stage of manufacture.

Referring now to FIG. 11, antimony layer 314 and TEOS layer 306 are removed or stripped from semiconductor material 302. A layer of dielectric material 318 is formed on or from semiconductor material 302 and doped regions 312 and 316. In accordance with an embodiment, dielectric material 306 is oxide doped with an impurity material of P-type conductivity that is formed by the decomposition of TEOS to form an oxide layer. The type of material for dielectric layer 306 is not a limitation of the present invention.

Figure 12:
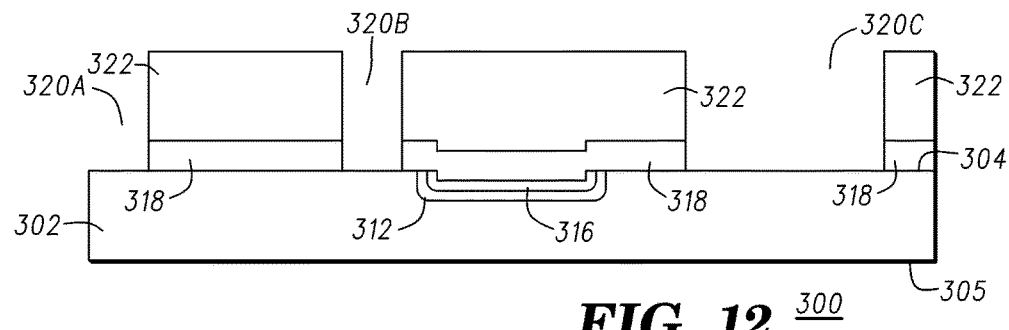
FIG. 12 is a cross-sectional view of the semiconductor component of FIG. 11 at a later stage of manufacture.

Referring now to FIG. 12 a layer of photoresist is formed on TEOS layer 318 and patterned to have openings 320A, 320B, and 320C that expose portions of TEOS layer 318. The remaining portions of the photoresist layer serve as a masking structure 322. Openings are formed in the exposed portions of TEOS layer 318 using, for example, an anisotropic reactive ion etch. The openings expose portions of semiconductor material 302.

Figure 13:
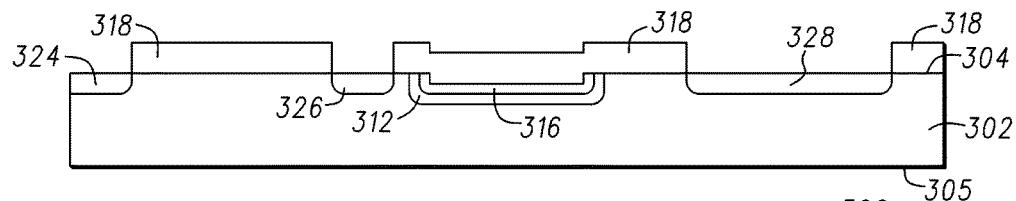
FIG. 13 is a cross-sectional view of the semiconductor component of FIG. 12 at a later stage of manufacture.

Referring now to FIG. 13, an impurity material of P-type conductivity is implanted into the exposed portions of semiconductor material 302 to form doped regions 324, 326, and 328. By way of example, the impurity material is boron. Masking structure 322 is removed.

Figure 14:
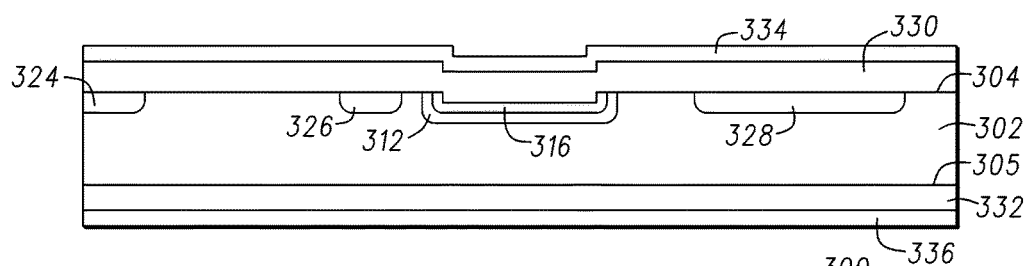
FIG. 14 is a cross-sectional view of the semiconductor component of FIG. 13 at a later stage of manufacture.

Referring now to FIG. 14, TEOS layer 318 is removed or stripped from semiconductor material 302. A layer of dielectric material 330 having a thickness ranging from about 5,000 Å to about 60,000 Å is formed on or from surface 304 and a layer of dielectric material 332 is formed on or from surface 305. In accordance with an embodiment, dielectric layers 330 and 332 are formed by the decomposition of TEOS to form oxide layers having thicknesses of about 7,000 Å. A layer of silicon nitride 334 is formed on TEOS layer 330 and a layer of silicon nitride 336 is formed on TEOS layer 332.

Figure 15:
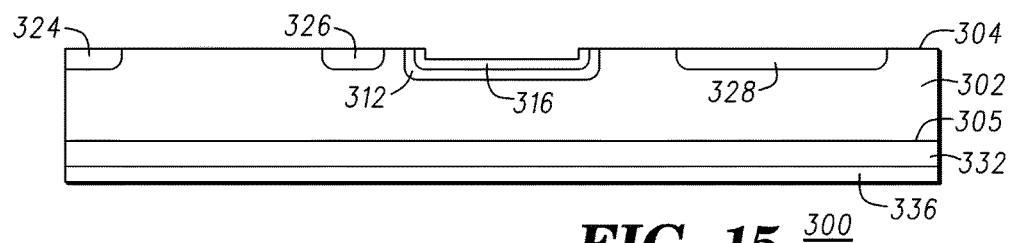
FIG. 15 is a cross-sectional view of the semiconductor component of FIG. 14 at a later stage of manufacture.

Referring now to FIG. 15, silicon nitride layer 334 is etched away using techniques known to those skilled in the art. After etching away silicon nitride layer 334, TEOS layer 330 is stripped away using techniques known to those skilled in the art.

Figure 16:
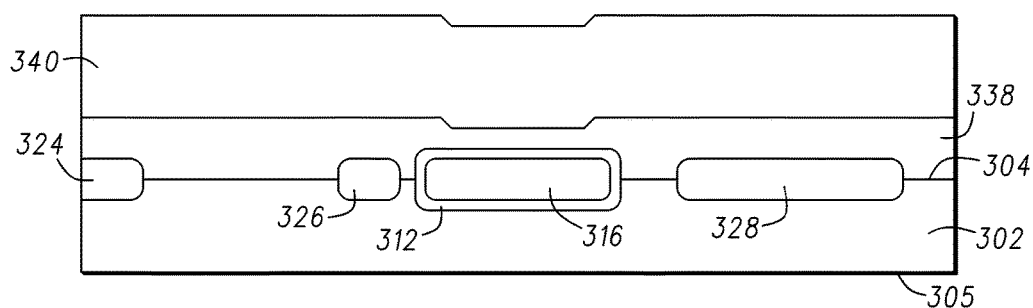
FIG. 16 is a cross-sectional view of the semiconductor component of FIG. 15 at a later stage of manufacture.

Referring now to FIG. 16, an epitaxial layer 338 having a thickness ranging from about 2 micrometers (2 µm) to about 6 µm and a resistivity ranging from about 4 Ω-cm to about 12 Ω-cm is formed on semiconductor material 302 and doped regions 312, 316, 324, 326, and 328. Subsequent to the formation of epitaxial layer 338, an epitaxial layer 340 having a thickness ranging from about 5 µm to about 12 µm and a resistivity ranging from about 50 Ω-cm to about 100 Ω-cm is formed on epitaxial layer 338. It should be noted that during the formation of epitaxial layers 338 and 340, doped regions 312, 316, 324, 326, and 328 diffuse into epitaxial layer 338. The impurity material of doped regions 312 and 316 also diffuse into semiconductor material 302. As those skilled in the art are aware, the impurity materials of doped regions 312, 316, 324, 326, and 328 diffuse in all directions, e.g., laterally and vertically; however, doped regions 324, 326, and 328 do not diffuse an appreciable distance into semiconductor material 302 compared to the distance they diffuse into epitaxial layer 338 because the concentration gradient of the impurity materials between doped regions 324, 326, and 328 and epitaxial layer 338 is much greater than it is between doped regions 324, 326, and 328 and semiconductor material 302. Doped regions 312 and 316, on the other hand, diffuse an appreciable distance both laterally and vertically because the concentration gradients between the impurity materials in these regions and those of semiconductor material 302 and epitaxial layer 338 is large.

After formation of epitaxial layers 338 and 340, a backside grind is performed to remove silicon nitride layer 336 and TEOS layer 332.

Figure 17:
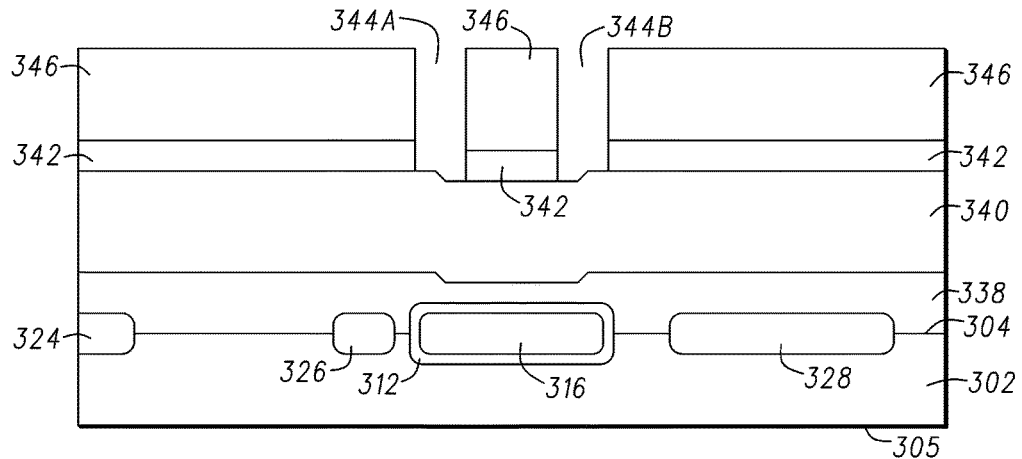
FIG. 17 is a cross-sectional view of the semiconductor component of FIG. 16 at a later stage of manufacture.

Referring now to FIG. 17, a layer of dielectric material 342 is formed on or from epitaxial layer 340. In accordance with an embodiment, dielectric material 342 is oxide formed by the decomposition of TEOS to form an oxide layer. The type of material for dielectric layer 306 is not a limitation of the present invention. A layer of photoresist is formed on TEOS layer 342 and patterned to have openings 344A and 344B that expose portions of TEOS layer 342. The remaining portions of the photoresist layer serve as a masking structure 346. Openings are formed in the exposed portions of TEOS layer 342 using, for example, an anisotropic reactive ion etch. The openings expose portions of epitaxial layer 340.

Figure 18:
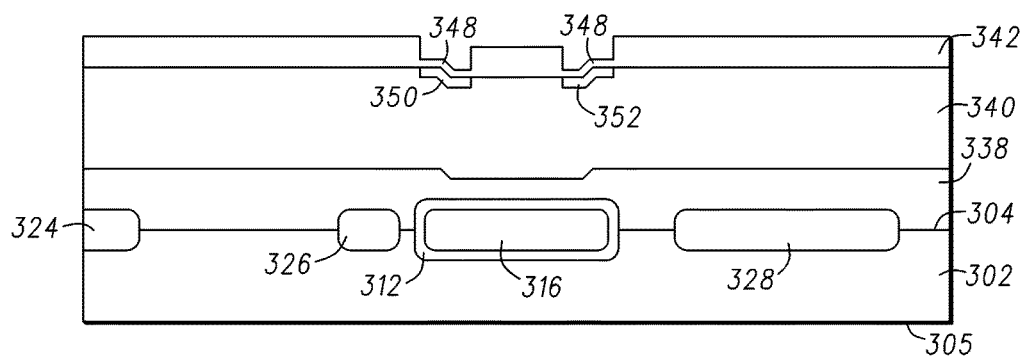
FIG. 18 is a cross-sectional view of the semiconductor component of FIG. 17 at a later stage of manufacture.

Referring now to FIG. 18, masking structure 346 is removed and screen oxide layers 348 are formed on the exposed portions of epitaxial layer 340. Formation of screen oxide layers 348 also increases the thickness of TEOS layer 342, however the increase is very small compared to the thickness of TEOS layer 324. Therefore, the change in thickness of TEOS layer 342 is not shown in FIG. 18. An impurity material of N-type conductivity is implanted through screen oxide layers 348 into epitaxial layer 340 to form doped regions 350 and 352. Those skilled in the art will appreciate that the impurity material is also implanted into TEOS layer 342. By way of example, the impurity material is phosphorus.

Figure 19:
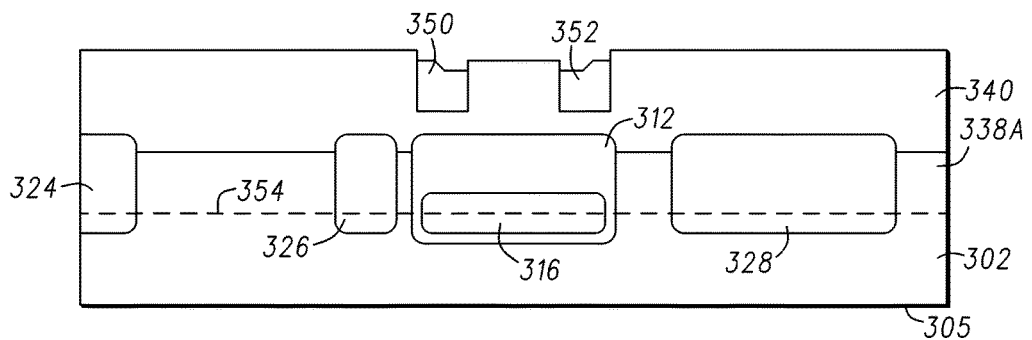
FIG. 19 is a cross-sectional view of the semiconductor component of FIG. 18 at a later stage of manufacture.

Referring now to FIG. 19, semiconductor component 300 undergoes a drive-in step that drives the impurity material of doped regions 350 and 352 into epitaxial layer 340. In addition, the drive-in step drives the P-type material of semiconductor material into epitaxial layer 338 compensating the impurity material of this region so that it has a P-type conductivity. The compensated region is identified by reference character 338A. The drive-in step drives the impurity materials of doped regions 316, 324, 326, and 328 into epitaxial layer 340. The impurity material of doped region 312 is also driven further into semiconductor material 302. The impurity material of doped region 316 also diffuses laterally and vertically, however the diffusion constant of this impurity material, i.e., arsenic, is much less than that of the doped region 312, i.e., phosphorus. By way of example, the drive-in step is performed using a diffusion furnace. The ambient within the furnace may be steam or oxygen, which increases the thicknesses of oxide layers 342 and 348. For the sake of clarity, reference characters 312, 316, 324, 326, 328, 350, and 352 are used to indicate the doped regions before and after diffusion. Broken line 354 is included to indicate the original interface between semiconductor material 302 and layer 338A.

Figure 20:
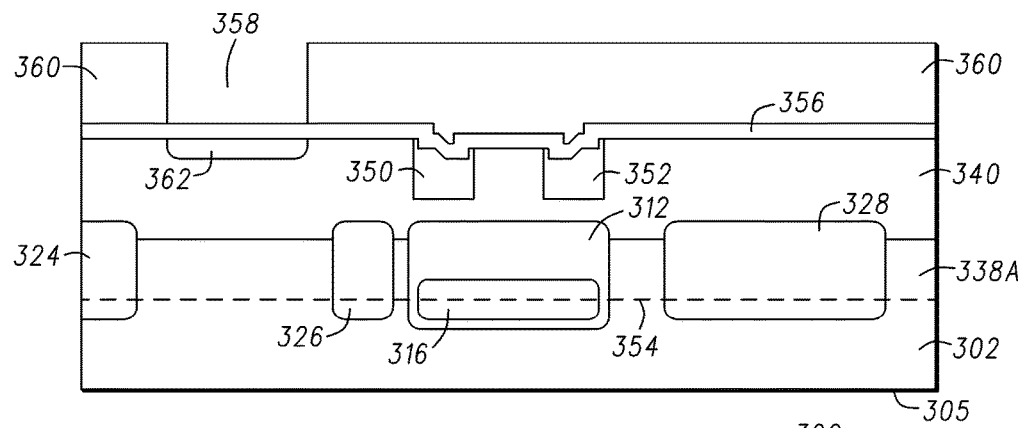
FIG. 20 is a cross-sectional view of the semiconductor component of FIG. 19 at a later stage of manufacture.

Referring now to FIG. 20, TEOS layer 342 and screen oxide layers 348 are stripped from semiconductor component 300 and a screen oxide layer 356 is formed on or from epitaxial layer 340 and doped regions 350 and 352. A layer of photoresist is formed on screen oxide layer 356 and patterned to have at least one opening 358 that exposes a portion of screen oxide layer 356. The remaining portions of the photoresist layer serve as a masking structure 360. An impurity material of N-type conductivity is implanted through screen oxide layer 356 into epitaxial layer 340 to form a doped region 362. By way of example, the impurity material is phosphorus.

Figure 21:
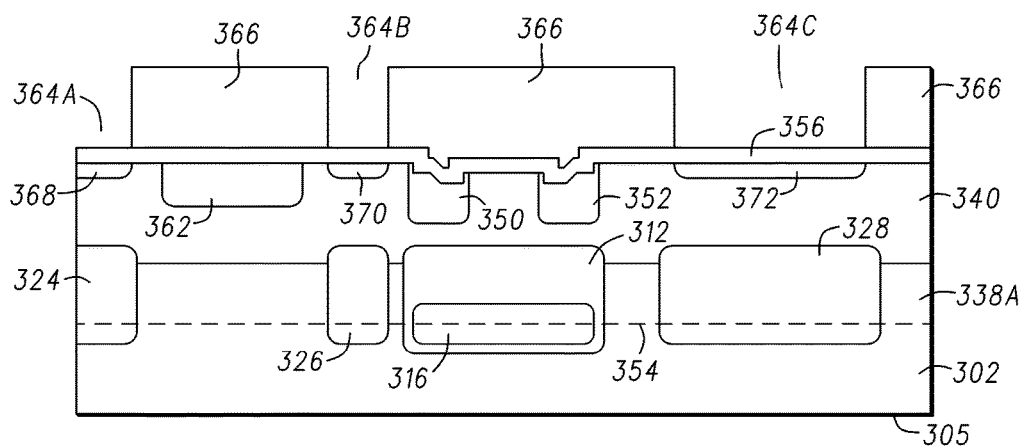
FIG. 21 is a cross-sectional view of the semiconductor component of FIG. 20 at a later stage of manufacture.

Referring now to FIG. 21, masking structure 360 is removed and semiconductor component 300 undergoes a drive-in step that drives the impurity material of doped region 362 into epitaxial layer 340. In addition, the drive-in step drives the impurity materials of doped regions 316, 324, 326, 328, 350, and 352 further into epitaxial layer 340. The impurity material of doped region 312 is also driven further into semiconductor material 302. The impurity material of doped region 316 also diffuses laterally and vertically, however the diffusion constant of this impurity material, i.e., arsenic, is much less than that of the doped region 312, i.e., phosphorus. By way of example, the drive-in step is performed using a diffusion furnace. The ambient within the furnace may be steam or oxygen, which increases the thickness of screen oxide layer 356. As discussed above, reference characters 312, 316, 324, 326, 328, 350, and 352 are used to indicate the doped regions before and after diffusion. Similarly reference character 362 is used to indicate the doped region before and after diffusion.

A layer of photoresist is formed on screen oxide layer 356 and patterned to have openings 364A, 364B, and 364C that expose portions of screen oxide layer 356. The remaining portions of the photoresist layer serve as a masking structure 366. An impurity material of P-type conductivity is implanted through screen oxide layer 356 into epitaxial layer 340 to form doped regions 368, 370, and 372. By way of example, the impurity material is boron.

Figure 22:
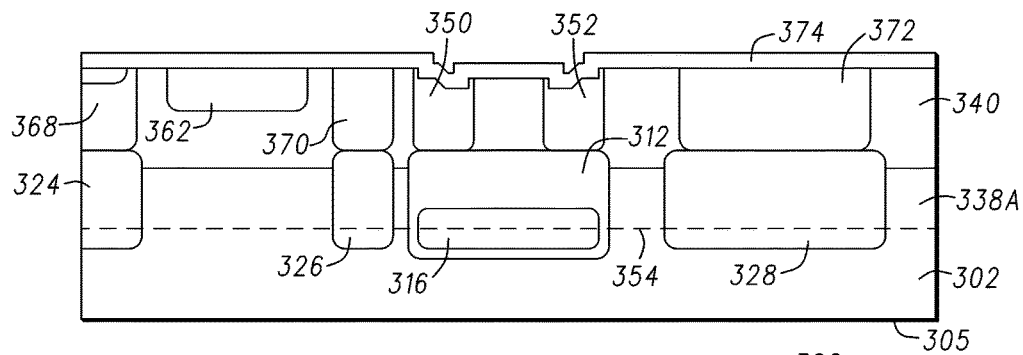
FIG. 22 is a cross-sectional view of the semiconductor component of FIG. 21 at a later stage of manufacture.

Referring now to FIG. 22, masking structure 366 is removed and semiconductor component 300 undergoes a drive-in step that drives the impurity material of doped regions 368, 370, and 372 into epitaxial layer 340. More particularly, the drive-in step drives the impurity materials of doped regions 324 and 368 so that they merge together, the impurity materials of doped regions 326 and 370 so that they merge together, the impurity materials of doped regions 328 and 372 so that they merge together, the impurity materials of doped regions 312 and 350 so that they merge together, and the impurity materials of doped regions 312 and 352 so that they merge together. The impurity material of doped region 312 is also driven further into semiconductor material 302. As discussed above, the impurity material of doped region 316 also diffuses laterally and vertically, however the diffusion constant of this impurity material, i.e., arsenic, is much less than that of the doped region 312, i.e., phosphorus. By way of example, the drive-in step is performed using a diffusion furnace. The ambient within the furnace may be steam or oxygen, which increases the thickness of screen oxide layer 356. However, screen oxide layer 356 is stripped from semiconductor component 300. A screen oxide layer 374 is formed on or from epitaxial layer 340 and doped regions 350, 352, 362, 368, 370, and 372.

Figure 23:
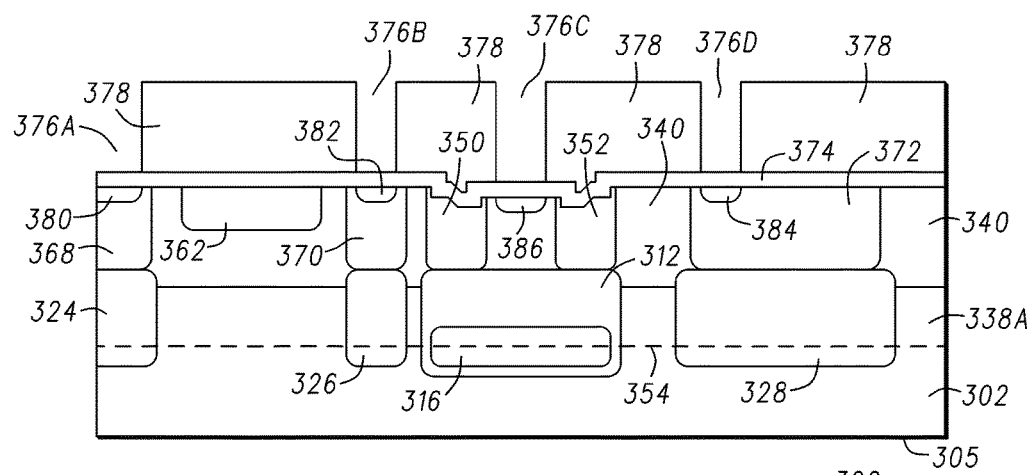
FIG. 23 is a cross-sectional view of the semiconductor component of FIG. 22 at a later stage of manufacture.

Referring now to FIG. 23, a layer of photoresist is formed on screen oxide layer 374 and patterned to have openings 376A, 376B, 376C, and 376D that expose portions of screen oxide layer 374. The remaining portions of the photoresist layer serve as a masking structure 378. An impurity material of P-type conductivity is implanted through screen oxide layer 374 into the portions of doped regions 368, 370, and 372 exposed by openings 376A, 376B, and 376D to form doped regions 380, 382, and 384, respectively. The impurity of P-type conductivity is also implanted into the portion of epitaxial layer 340 exposed by opening 376C to form doped region 386. By way of example, the impurity material is boron.

Figure 24:
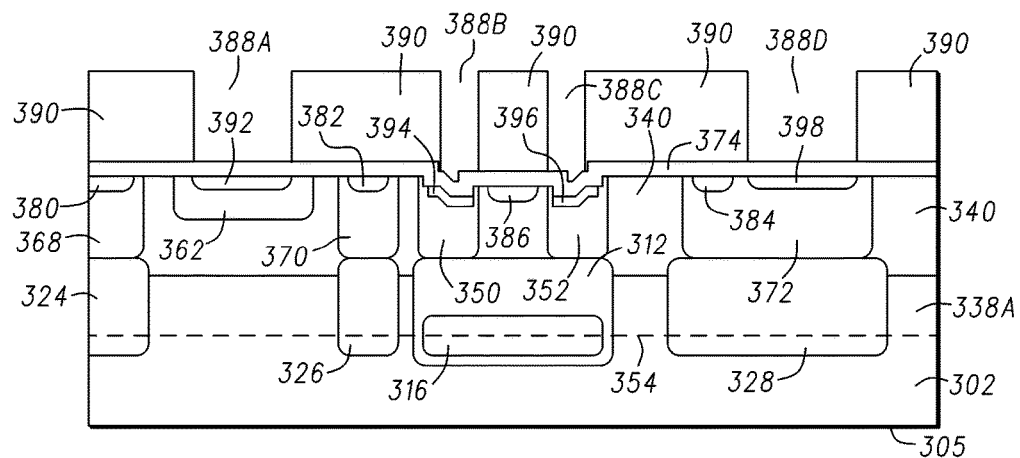
FIG. 24 is a cross-sectional view of the semiconductor component of FIG. 23 at a later stage of manufacture.

Referring now to FIG. 24, masking structure 378 is removed and a layer of photoresist is formed on screen oxide layer 374 and patterned to have openings 388A, 388B, 388C, and 388D that expose portions of screen oxide layer 374. The remaining portions of the photoresist layer serve as a masking structure 390. An impurity material of N-type conductivity is implanted through screen oxide layer 374 into the portions of doped regions 362, 350, 352, and 372 exposed by openings 388A, 388B, 388C, and 388D to form doped regions 392, 394, 396, and 398, respectively. By way of example, the impurity material is boron.

Figure 25:
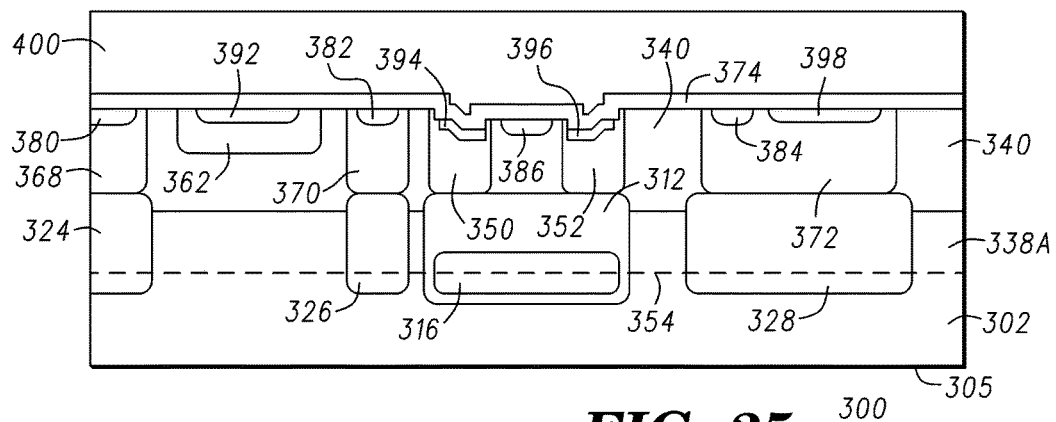
FIG. 25 is a cross-sectional view of the semiconductor component of FIG. 24 at a later stage of manufacture.

Referring now to FIG. 25, masking structure 390 is removed and a layer of dielectric material 400 is formed on screen oxide layer 374. Suitable materials for dielectric layer 400 include undoped silicate glass (USG), spin on glass (SOG), phospho silicate glass (PSG), boro-phospho silicate glass (BPSG), flowable oxide (FOX), tetraethyl ortho silicate (TEOS), plasma enhanced-TEOS (PE-TEOS), fluorosilicate glass (FSG), Tonen silazene (TOSZ), high density plasma-chemical vapor deposition (HDP-CVD) oxide, or the like.

Figure 26:
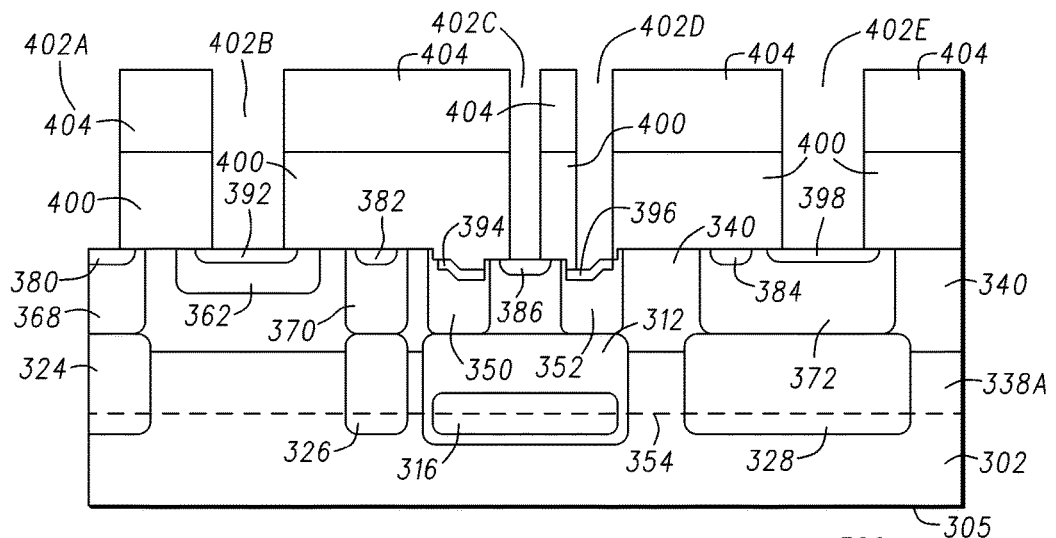
FIG. 26 is a cross-sectional view of the semiconductor component of FIG. 25 at a later stage of manufacture.

Referring now to FIG. 26, a layer of photoresist is formed on dielectric layer 400 and patterned to have openings 402A, 402B, 402C, 402D, and 402E that expose portions of dielectric layer 400. The remaining portions of the photoresist layer serve as a masking structure 404. Openings are formed in the exposed portions of dielectric layer 400 using, for example, an anisotropic reactive ion etch. The openings expose portions of doped regions 380, 392, 386, 396, and 398.

Figure 27:
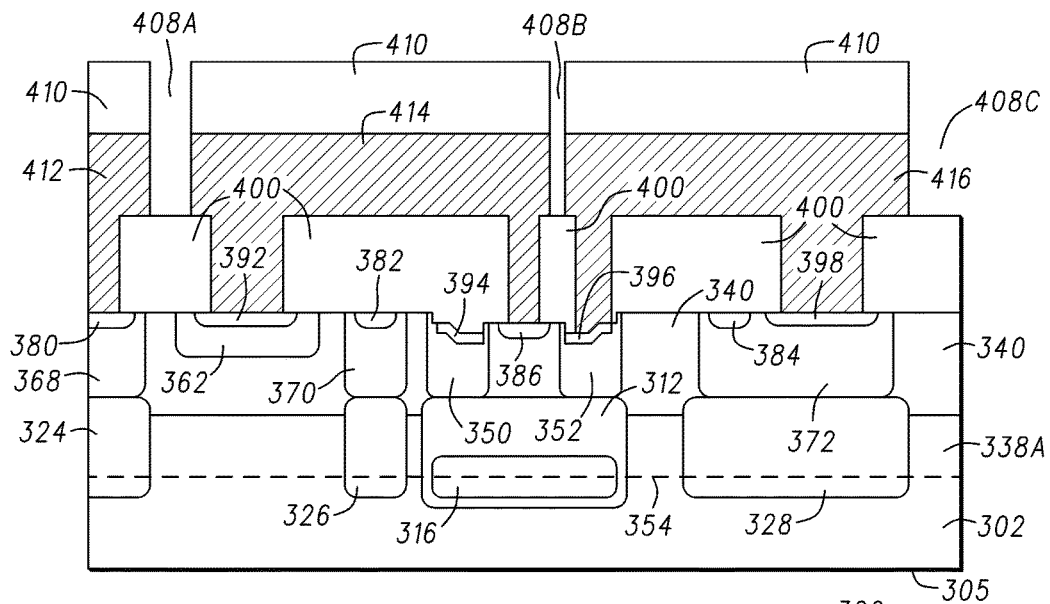
FIG. 27 is a cross-sectional view of the semiconductor component of FIG. 26 at a later stage of manufacture.

Referring now to FIG. 27, masking structure 404 is removed. A layer of electrically conductive material is formed on dielectric layer 400 and in contact with doped regions 380, 392, 386, 396, and 398 that were exposed by etching dielectric layer 400. By way of example, the electrically conductive layer is aluminum that is deposited using a sputter deposition process. A layer of photoresist is formed on the electrically conductive layer and patterned to have openings 408A, 408B, and 408C that expose portions of the electrically conductive layer. The remaining portions of the photoresist layer serve as a masking structure 410. The exposed portions of the electrically conductive layer are etched to form electrical interconnects 412, 414, and 416. Etching the electrically conductive material forms openings through the electrically conductive material that are extensions of openings 408A, 408B, and 408C and that expose portions of dielectric layer 400.

Figure 28:
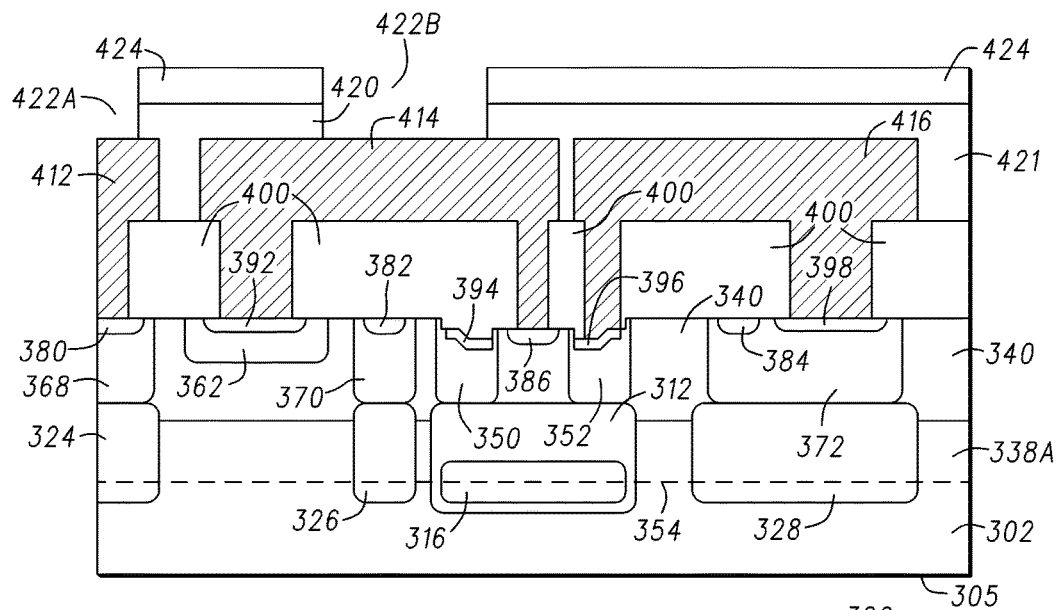
FIG. 28 is a cross-sectional view of the semiconductor component of FIG. 27 at a later stage of manufacture.

Referring now to FIG. 28, masking structure 410 is removed and a passivation layer is formed on electrical interconnects 412, 414, and 416 and in the openings exposing dielectric layer 400. A layer of photoresist is formed on the electrically conductive layer and patterned to have openings 422A and 422B that expose portions of the passivation layer. The remaining portions of the photoresist layer serve as a masking structure 424. The exposed portions of the passivation layer are removed using for example an anisotropic etch to expose portions of electrical interconnects 412 and 416. After removal of the portions of the passivation layer, portions 420 and 421 remain.

Figure 29:
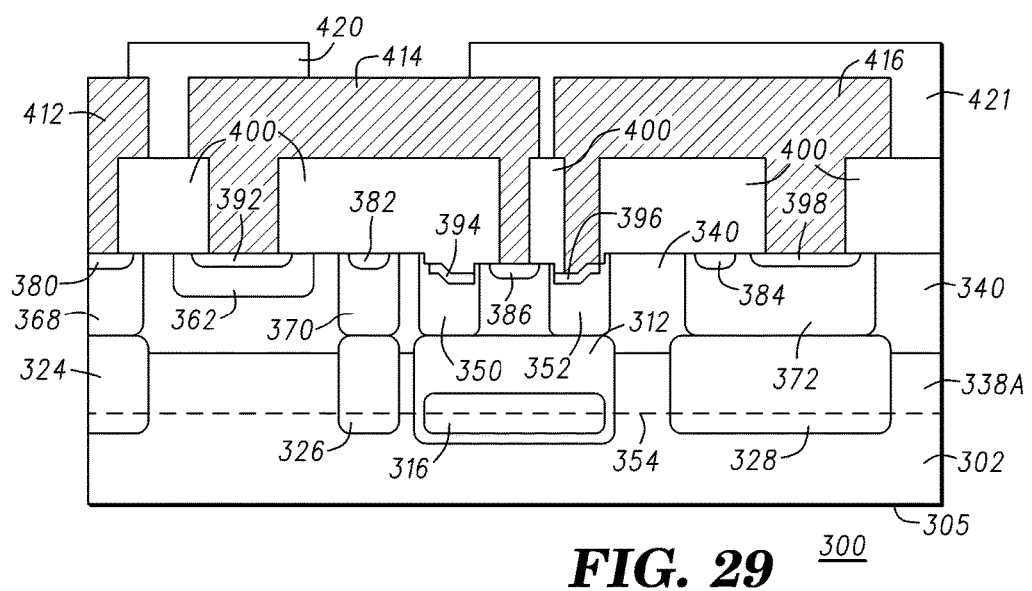
FIG. 29 is a cross-sectional view of the semiconductor component of FIG. 28 at a later stage of manufacture.

Referring now to FIG. 29, masking structure 424 is removed.

Figure 30:
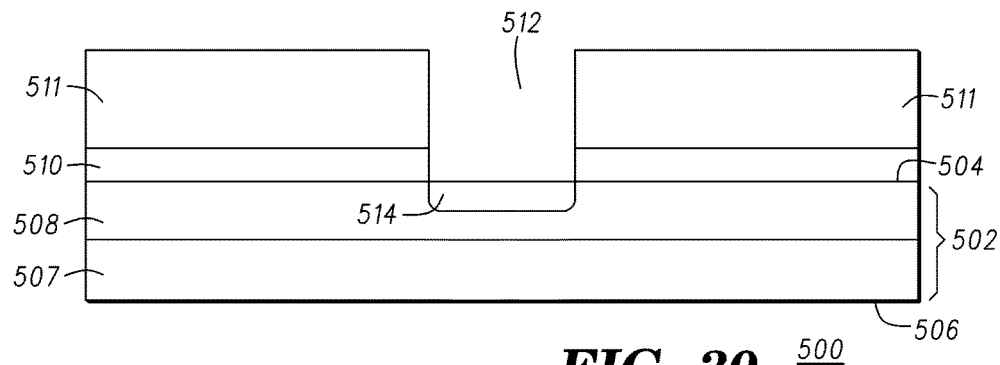
FIG. 30 is a cross-sectional view of a portion of a semiconductor component at an early stage of manufacture in accordance with another embodiment of the present invention.

FIG. 30 is a cross-sectional view of a portion of a semiconductor component 500 in accordance with an embodiment of the present invention. What is shown in FIG. 30 is a semiconductor material 502 having major surfaces 504 and 506, wherein the semiconductor material 502 is comprised of a semiconductor substrate 507 having an epitaxial material 508 formed thereon. By way of example, substrate 507 is silicon doped with an impurity material of P-type conductivity and epitaxial layer 508 is epitaxially grown silicon doped with an impurity material of P-type conductivity. The impurity material of P-type conductivity may be boron, indium, or other suitable P-type dopant or doping material. The resistivity of substrate 507 may range from about 0.001 Ω-cm to about 10,000 Ω-cm and the resistivity of epitaxial layer 508 may be greater than 1 Ω-cm. The thickness of epitaxial layer 508 may range from about 0.5 μm to about 5 μm.

Although semiconductor substrate 502 and epitaxial layer 508 may be high resistivity materials, the resistivities or dopant concentrations of these materials are not limiting. Likewise, semiconductor material 502 is not limited to being silicon and its conductivity type is not limited to being P-type conductivity. It should be understood that an impurity material is also referred to as a dopant or impurity species. Other suitable materials for semiconductor material 502 include polysilicon, germanium, silicon germanium, Semiconductor-On-Insulator ("SOI") material, an epitaxial layer formed on a bulk silicon material, and the like. In addition, semiconductor material 502 can be comprised of a compound semiconductor material such as Group III-V semiconductor materials, Group II-VI semiconductor materials, etc.

A layer of dielectric material 510 having a thickness ranging from about 1,000 Å to about 60,000 Å is formed on or from surface 504. In accordance with an embodiment, dielectric material 510 is formed by the decomposition of TEOS to form an oxide layer having a thickness of about 8,000 Å. The type of material for dielectric layer 510 is not a limitation of the present invention. A layer of photoresist is formed on TEOS layer 510 and patterned to have at least one opening 512 that exposes a portion of TEOS layer 510. The remaining portions of the photoresist layer serve as a masking structure 511.

An opening is formed in the exposed portion of TEOS layer 510 using, for example, an anisotropic reactive ion etch. The opening exposes a portion of epitaxial layer 508. An impurity material or dopant of N-type conductivity is implanted into the exposed portion of epitaxial layer 508 to form a doped region 514. By way of example, the impurity material is phosphorus.

Figure 31:
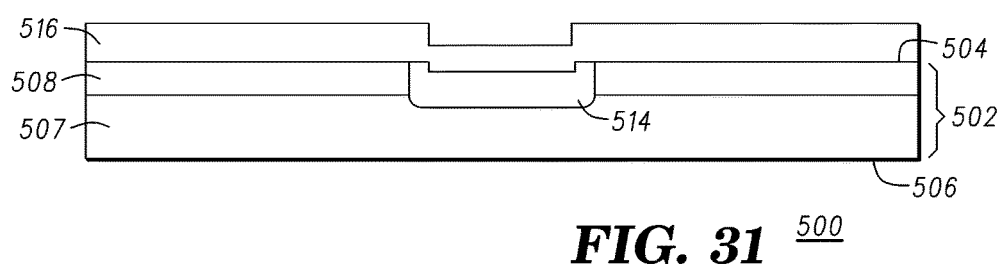
FIG. 31 is a cross-sectional view of the semiconductor component of FIG. 30 at a later stage of manufacture.

Referring now to FIG. 31, masking structure 511 is removed and dielectric layer 510 is removed or stripped from epitaxial layer 508. A layer of dielectric material 516 is formed on or from epitaxial layer 508 and doped region 514. In accordance with an embodiment, dielectric material 516 is oxide doped with an impurity material of P-type conductivity that may be TEOS. The type of material for dielectric layer 516 is not a limitation of the present invention. For example, dielectric layer 516 may be boro-phospho silicate glass, or the like. Formation of dielectric layer 516 drives the impurity material of doped region 514 through epitaxial layer 508 into silicon substrate 507. For the sake of clarity, reference character 514 is used to indicate the doped region before and after diffusion.

Figure 32:
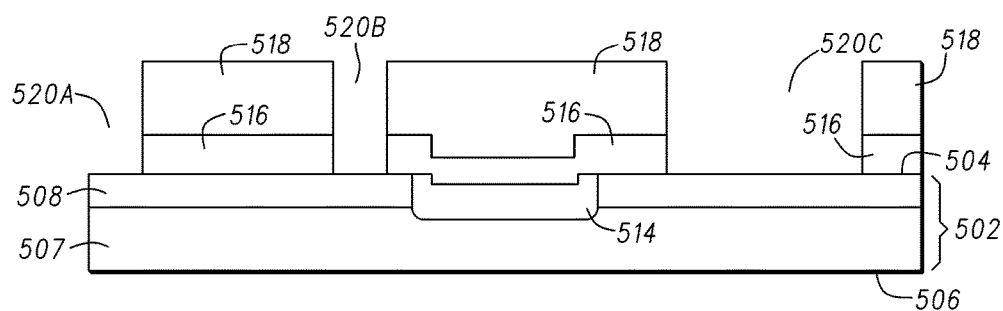
FIG. 32 is a cross-sectional view of the semiconductor component of FIG. 31 at a later stage of manufacture.

Referring now to FIG. 32 a layer of photoresist is formed on TEOS layer 516 and patterned to have openings 520A, 520B, and 520C that expose portions of TEOS layer 516. The remaining portions of the photoresist layer serve as a masking structure 518. Openings are formed in the exposed portions of TEOS layer 516 using, for example, an anisotropic reactive ion etch. The openings expose portions of epitaxial layer 508.

Figure 33:
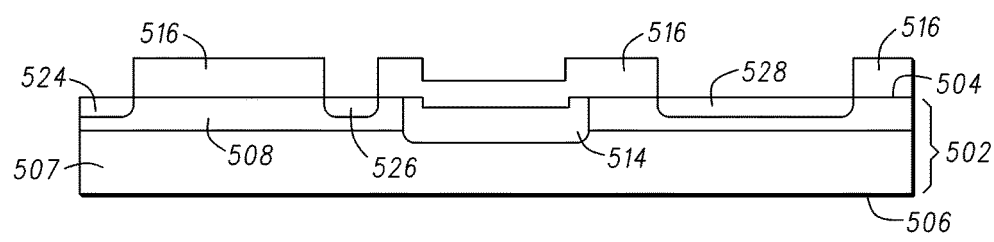
FIG. 33 is a cross-sectional view of the semiconductor component of FIG. 32 at a later stage of manufacture.

Referring now to FIG. 33, an impurity material of P-type conductivity is implanted into the exposed portions of epitaxial layer 508 to form doped regions 524, 526, and 528. By way of example, the impurity material is boron. Masking structure 518 is removed and semiconductor component 500 undergoes a drive-in step that drives the impurity material of doped regions 524, 526, and 528 into epitaxial layer 508. In addition, the drive-in step drives the N-type material of doped region 514 further into substrate 507. The impurity materials of doped regions 514, 524, 526, and 528 also diffuse laterally and vertically. By way of example, the drive-in step is performed using a diffusion furnace. The ambient within the furnace may be steam or oxygen, which increases the thicknesses of oxide layer 516. Like reference character 514, reference characters 524, 526, and 528 are used to indicate the doped regions before and after diffusion.

Figure 34:
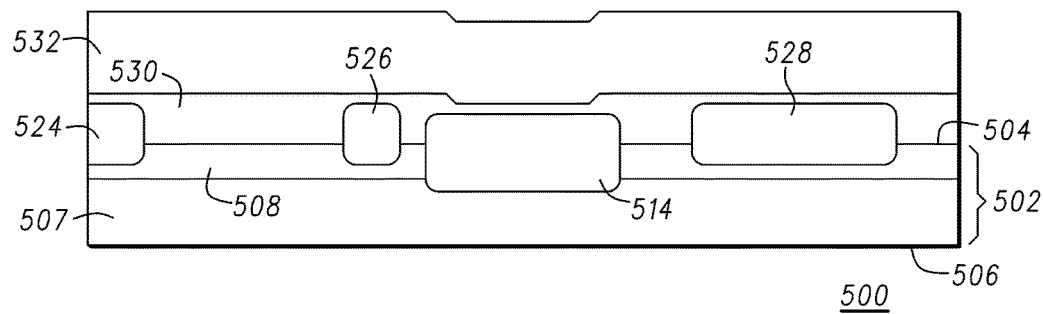
FIG. 34 is a cross-sectional view of the semiconductor component of FIG. 33 at a later stage of manufacture.

Referring now to FIG. 34, TEOS layer 516 is stripped from semiconductor component 500 and an epitaxial layer 530 having a thickness ranging from about 2 μm to about 6 μm and a resistivity ranging from about 4 Ω-cm to about 12 Ω-cm is formed on epitaxial layer 508 and doped regions 514, 524, 526, and 528. An epitaxial layer 532 having a thickness ranging from about 5 μm to about 12 μm and a resistivity ranging from about 50 Ω-cm to about 100 Ω-cm is formed on epitaxial layer 530. By way of example, epitaxial layer 530 has a thickness of about 4 μm and a resistivity of about 7 Ω-cm and epitaxial layer 532 has a thickness of about 7.5 μm and a resistivity of about 80 Ω-cm. It should be noted that during the formation of epitaxial layers 530 and 532, doped regions 514, 524, 526, and 528 diffuse into epitaxial layer 530. As those skilled in the art are aware, the impurity materials of doped regions 514, 524, 526, and 528 diffuse in all directions, i.e., laterally and vertically; however, doped regions 514, 524, 526, and 528 do not diffuse an appreciable distance into silicon substrate 507 compared to the distance they diffuse into epitaxial layer 530 because the concentration gradient of the impurity materials between doped regions 514, 524, 526, and 528 and epitaxial layer 530 is much greater than it is between doped regions 514, 524, 526, and 528 and silicon substrate 507.

Figure 35:
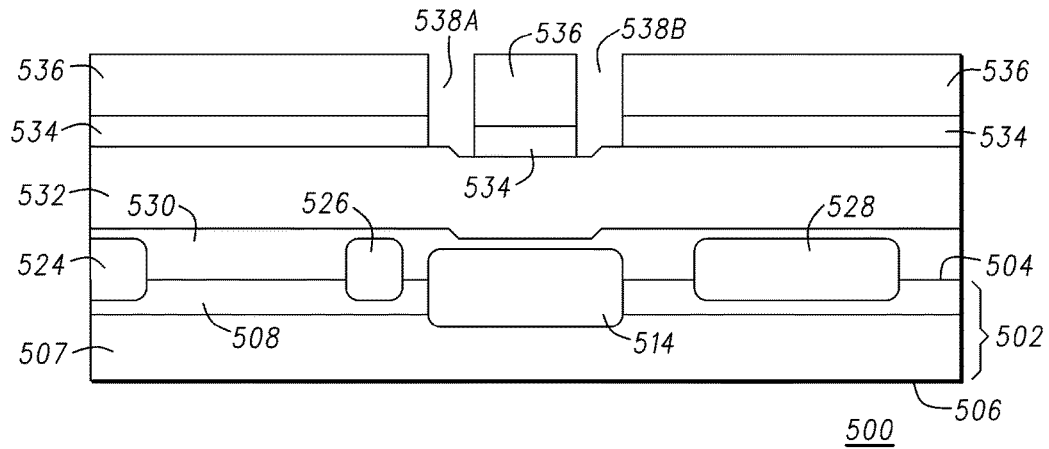
FIG. 35 is a cross-sectional view of the semiconductor component of FIG. 34 at a later stage of manufacture.

Referring now to FIG. 35, a layer of dielectric material 534 is formed on or from epitaxial layer 532. In accordance with an embodiment, dielectric material 534 is an oxide such as, for example, TEOS which forms an oxide layer. The type of material for dielectric layer 534 is not a limitation of the present invention. A layer of photoresist is formed on TEOS layer 534 and patterned to have openings 538A and 538B that expose portions of TEOS layer 534. The remaining portions of the photoresist layer serve as a masking structure 536. Openings are formed in the exposed portions of TEOS layer 534 using, for example, an anisotropic reactive ion etch. The openings expose portions of epitaxial layer 532.

Figure 36:
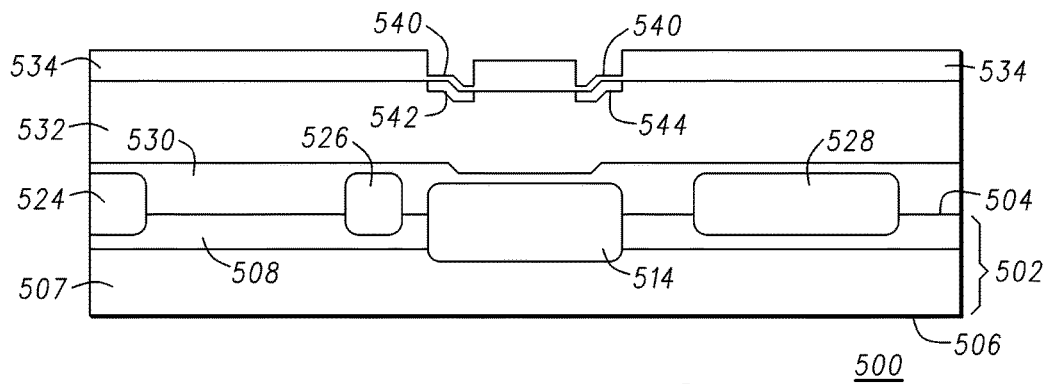
FIG. 36 is a cross-sectional view of the semiconductor component of FIG. 35 at a later stage of manufacture.

Referring now to FIG. 36, masking structure 536 is removed and screen oxide layers 540 are formed on the exposed portions of epitaxial layer 532. Formation of screen oxide layers 540 also increases the thickness of TEOS layer 534, however the increase is very small compared to the thickness of TEOS layer 534. Therefore, the change in thickness of TEOS layer 534 is not shown in FIG. 36. An impurity material of N-type conductivity is implanted through screen oxide layers 540 into epitaxial layer 532 to form doped regions 542 and 544. Those skilled in the art will appreciate that the impurity material is also implanted into TEOS layer 534. By way of example, the impurity material is phosphorus.

Figure 37:
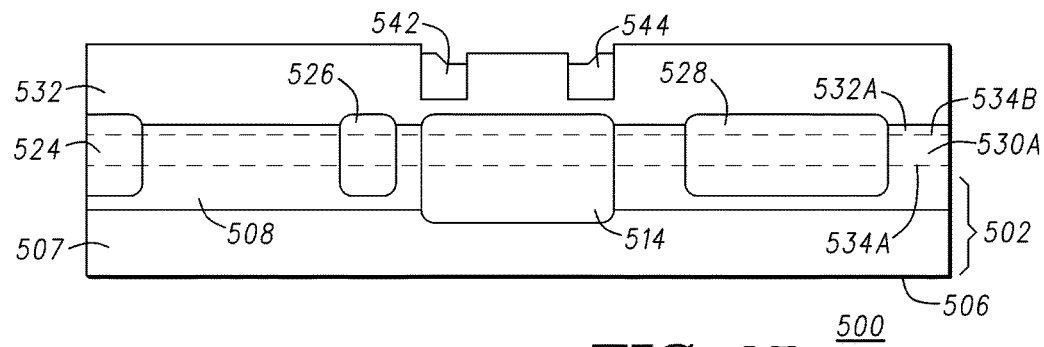
FIG. 37 is a cross-sectional view of the semiconductor component of FIG. 36 at a later stage of manufacture.

Referring now to FIG. 37, semiconductor component 500 undergoes a drive-in step that drives the impurity material of doped regions 542 and 544 into epitaxial layer 532. In addition, the drive-in step drives the P-type material of epitaxial layer 508 into epitaxial layer 530 and into a portion of epitaxial layer 532 compensating the impurity material of epitaxial layer 530 and the portion of epitaxial layer 532 so that they have P-type conductivity. The compensated portions are identified by reference characters 530A and 532A. The drive-in step drives the impurity materials of doped regions 524, 526, and 528 through epitaxial layer 530 into epitaxial layer 532. The impurity material of doped region 514 is also driven further into silicon substrate 507 and into epitaxial layer 532. By way of example, the drive-in step is performed using a diffusion furnace. The ambient within the furnace may be steam or oxygen. For the sake of clarity, reference characters 514, 524, 526, and 528 are used to indicate the doped regions before and after diffusion. Broken line 534A is included to indicate the original interface between epitaxial layer 508 and epitaxial layer 530 and broken line 534B is included to indicate the original interface between epitaxial layers 530 and 532.

Figure 38:
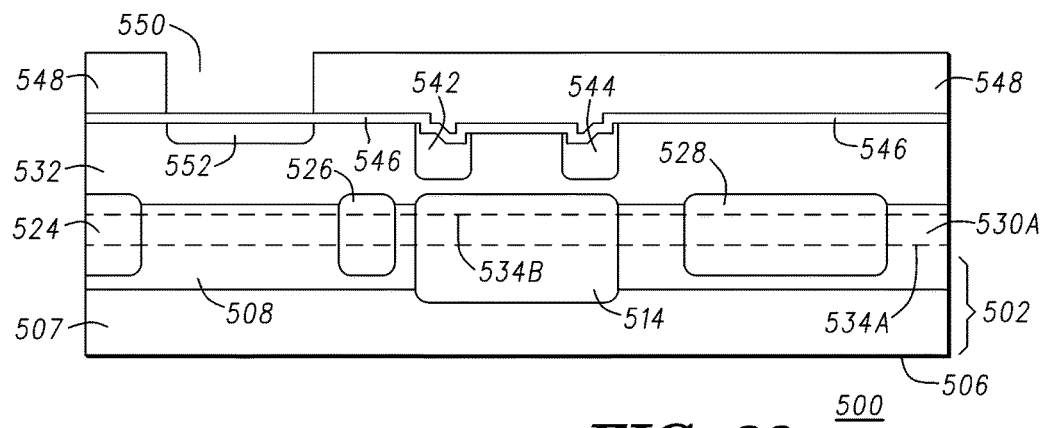
FIG. 38 is a cross-sectional view of the semiconductor component of FIG. 37 at a later stage of manufacture.

Referring now to FIG. 38, a screen oxide layer 546 is formed on or from epitaxial layer 532 and doped regions 542 and 544. A layer of photoresist is formed on screen oxide layer 546 and patterned to have at least one opening 550 that exposes a portion of screen oxide layer 546. The remaining portions of the photoresist layer serve as a masking structure 548. An impurity material of N-type conductivity is implanted through screen oxide layer 546 into epitaxial layer 532 to form a doped region 552. By way of example, the impurity material is phosphorus.

Figure 39:
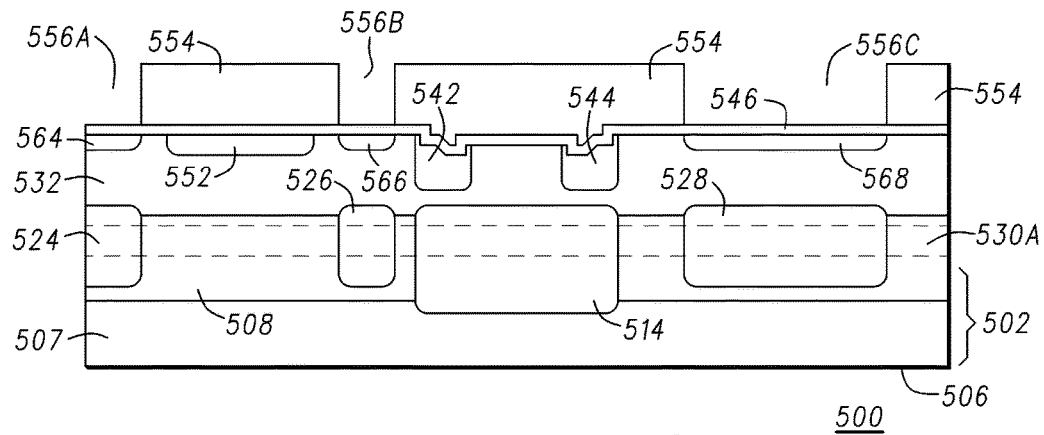
FIG. 39 is a cross-sectional view of the semiconductor component of FIG. 38 at a later stage of manufacture.

Referring now to FIG. 39, masking structure 548 is removed and semiconductor component 500 undergoes a drive-in step that drives the impurity material of doped region 552 into epitaxial layer 532. In addition, the drive-in step drives the impurity materials of doped region 514, 524, 526, and 528 further into epitaxial layer 532. The impurity material of doped region 514 is also driven further into silicon substrate 507. By way of example, the drive-in step is performed using a diffusion furnace. The ambient within the furnace may be steam or oxygen, which increases the thickness of screen oxide layer 546. As discussed above, reference characters 514, 524, 526, 528, 542, and 544 are used to indicate the doped regions before and after diffusion. Similarly reference character 552 is used to indicate the doped region before and after diffusion and reference character 546 is used to indicate oxide layer 546 before and after diffusion.

A layer of photoresist is formed on screen oxide layer 546 and patterned to have openings 556A, 556B, and 556C that expose portions of screen oxide layer 546. The remaining portions of the photoresist layer serve as a masking structure 554. An impurity material of P-type conductivity is implanted through the portions of screen oxide layer 546 unprotected by masking structure 554 into epitaxial layer 532 to form doped regions 564, 566, and 568. By way of example, the impurity material is boron.

Figure 40:
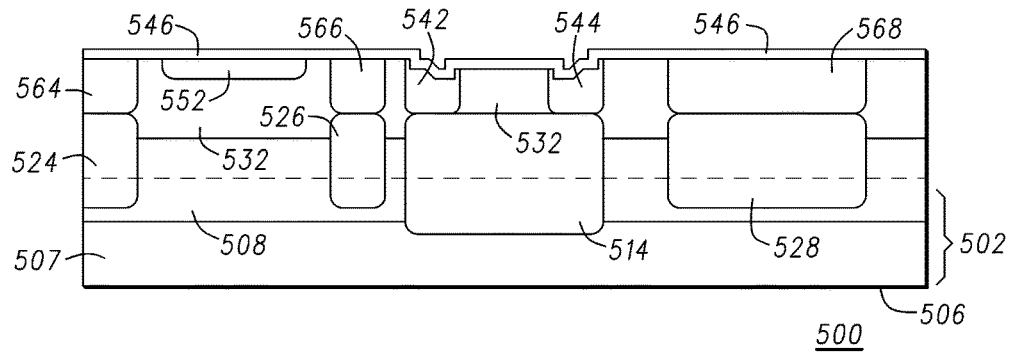
FIG. 40 is a cross-sectional view of the semiconductor component of FIG. 39 at a later stage of manufacture.

Referring now to FIG. 40, masking structure 554 is removed and semiconductor component 500 undergoes a drive-in step that drives the impurity material of doped regions 564, 566, and 568 into epitaxial layer 532. More particularly, the drive-in step drives the impurity materials of doped regions 524 and 564 so that they merge together, the impurity materials of doped regions 526 and 566 so that they merge together, the impurity materials of doped regions 528 and 568 so that they merge together, the impurity materials of doped regions 542 and 514 so that they merge together, and the impurity materials of doped regions 544 and 514 so that they merge together. The impurity material of doped region 514 is also driven further into silicon substrate 507. By way of example, the drive-in step is performed using a diffusion furnace. The ambient within the furnace may be steam or oxygen, which increases the thickness of screen oxide layer 546.

Figure 41:
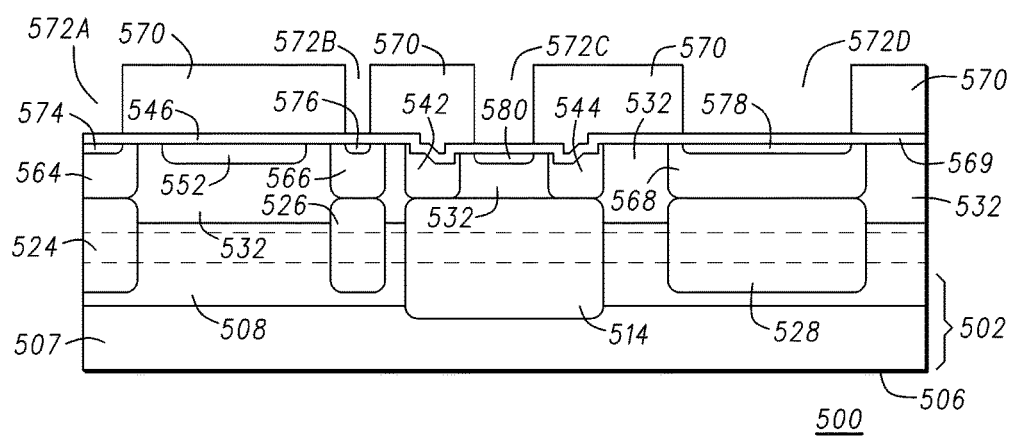
FIG. 41 is a cross-sectional view of the semiconductor component of FIG. 40 at a later stage of manufacture.

Referring now to FIG. 41, screen oxide layer 546 is stripped from semiconductor component 500. A screen oxide layer 569 is formed on or from epitaxial layer 532 and doped regions 564, 552, 566, 542, 544, and 568. A layer of photoresist is formed on screen oxide layer 569 and patterned to have openings 572A, 572B, 572C, and 572D that expose portions of screen oxide layer 569. The remaining portions of the photoresist layer serve as a masking structure 570. An impurity material of P-type conductivity is implanted through screen oxide layer 569 into the portions of doped regions 564, 566, and 568 unprotected by masking structure 570 to form doped regions 574, 576, 578, in doped regions 564, 566, and 568, respectively, and to form a doped region 580 in epitaxial layer 532. By way of example, the impurity material is boron.

Figure 42:
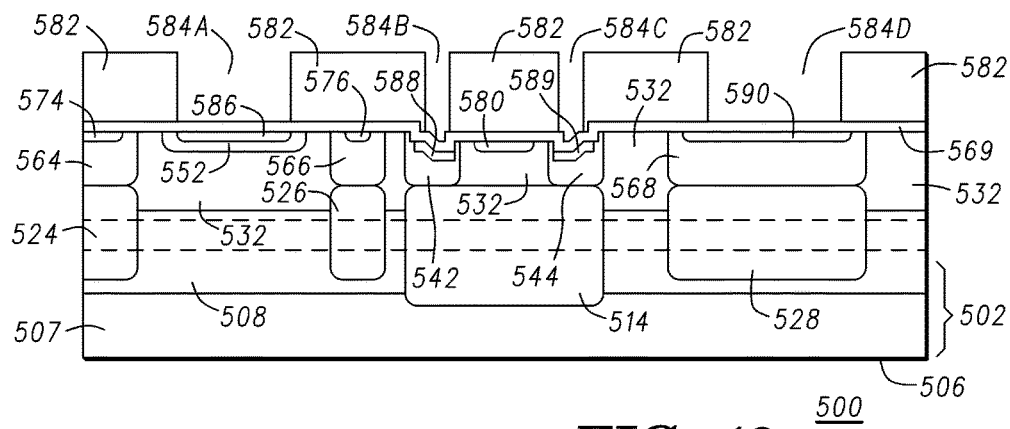
FIG. 42 is a cross-sectional view of the semiconductor component of FIG. 41 at a later stage of manufacture.

Referring now to FIG. 42, masking structure 570 is removed and a layer of photoresist is formed on screen oxide layer 569 and patterned to have openings 584A, 584B, 584C, and 584D that expose portions of screen oxide layer 569. The remaining portions of the photoresist layer serve as a masking structure 582. An impurity material of N-type conductivity is implanted through the portions of screen oxide layer 569 unprotected by masking structure 582 and into the portions of doped regions 552, 542, 544, and 568 unprotected by masking structure 582 to form doped regions 586, 588, 589, and 590, respectively. By way of example, the impurity material is boron implanted.

Figure 43:
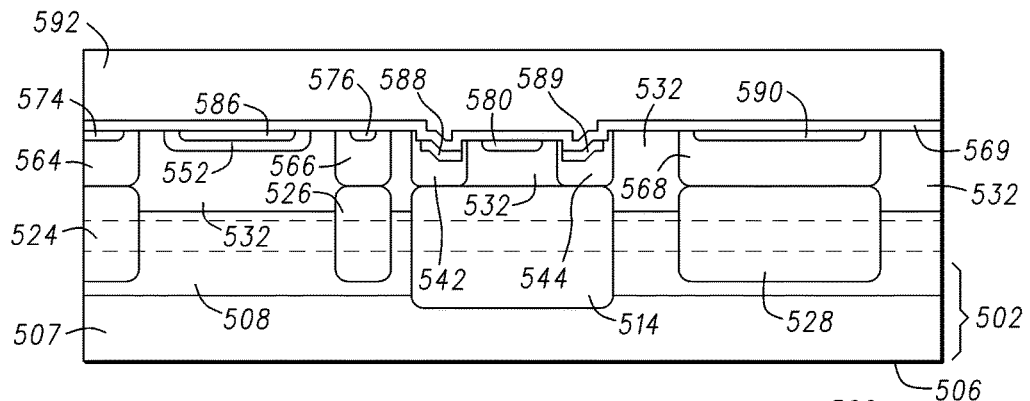
FIG. 43 is a cross-sectional view of the semiconductor component of FIG. 42 at a later stage of manufacture.

Referring now to FIG. 43, masking structure 582 is removed and a layer of dielectric material 592 is formed on screen oxide layer 569. Suitable materials for dielectric layer 592 include undoped silicate glass (USG), spin on glass (SOG), phospho silicate glass (PSG), boro-phospho silicate glass (BPSG), flowable oxide (FOX), tetraethyl ortho silicate (TEOS), plasma enhanced-TEOS (PE-TEOS), fluoro-silicate glass (FSG), Tonen silazene (TOSZ), high density plasma-chemical vapor deposition (HDP-CVD) oxide, or the like.

Figure 44:
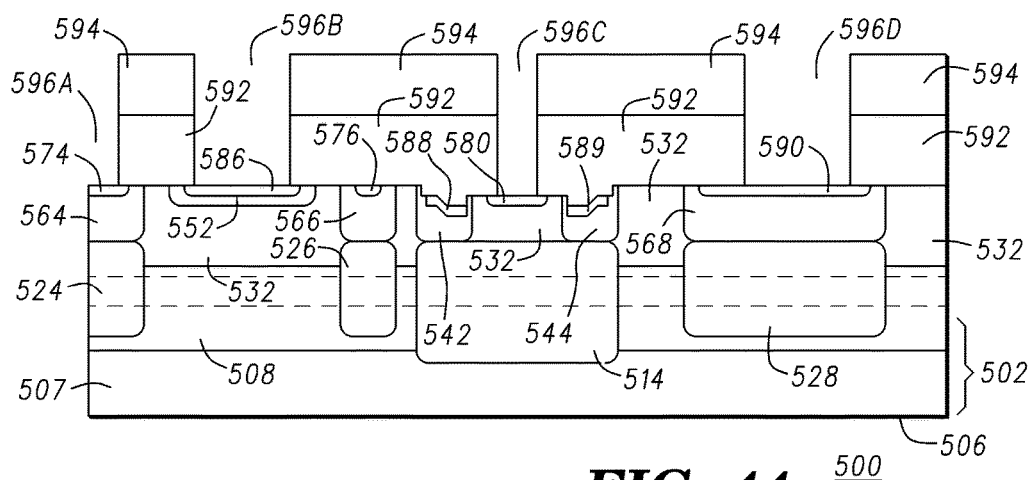
FIG. 44 is a cross-sectional view of the semiconductor component of FIG. 43 at a later stage of manufacture.

Referring now to FIG. 44, a layer of photoresist is formed on dielectric layer 592 and patterned to have openings 596A, 596B, 596C, and 596D that expose portions of dielectric layer 592. The remaining portions of the photoresist layer serve as a masking structure 594. Openings are formed in the exposed portions of dielectric layer 592 using, for example, an anisotropic reactive ion etch. The openings expose portions of doped regions 574, 586, 580, and 590.

Figure 45:
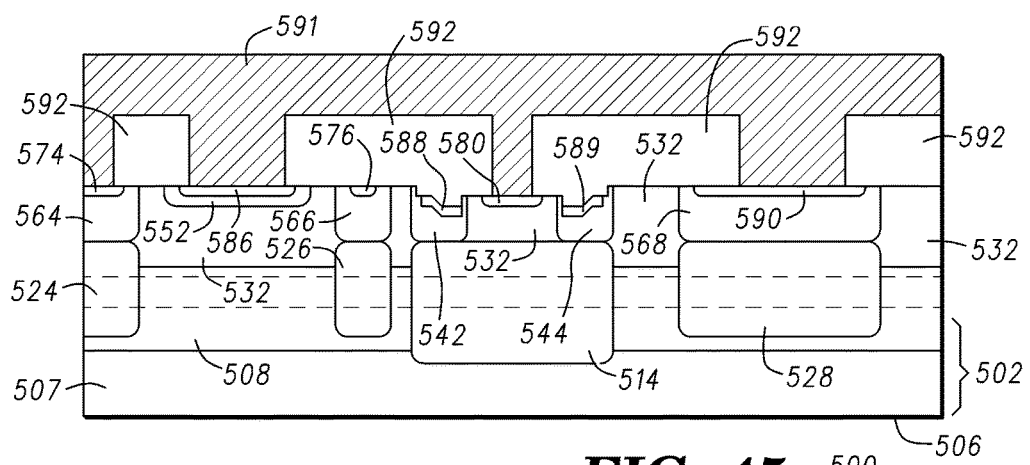
FIG. 45 is a cross-sectional view of the semiconductor component of FIG. 44 at a later stage of manufacture.

Referring now to FIG. 45, masking structure 594 is removed. A layer of electrically conductive material 591 is formed on dielectric layer 592 and in contact with doped regions 574, 586, 580, and 590 that were exposed by etching dielectric layer 592. By way of example, electrically conductive layer 591 is aluminum that is deposited using a sputter deposition process.

Figure 46:
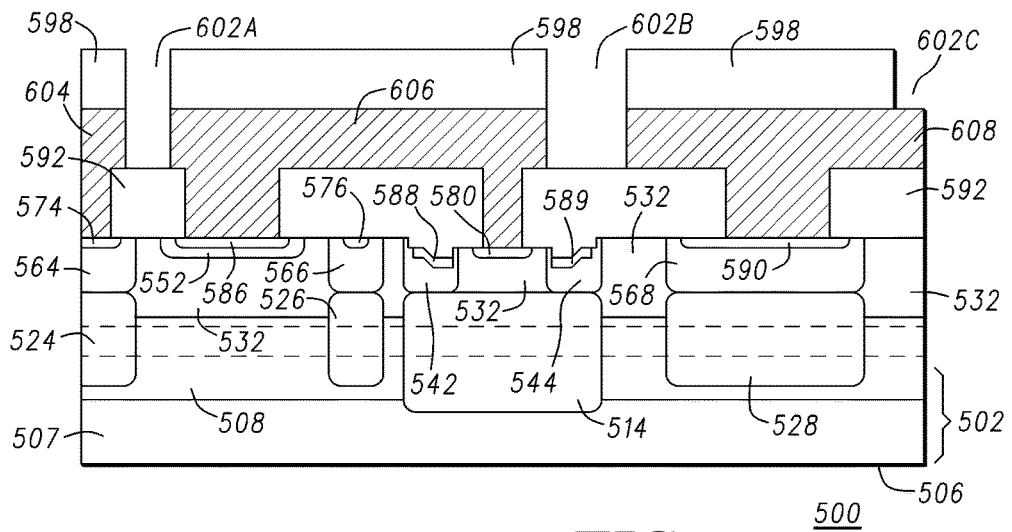
FIG. 46 is a cross-sectional view of the semiconductor component of FIG. 45 at a later stage of manufacture.

Referring now to FIG. 46, a layer of photoresist is formed on the electrically conductive layer and patterned to have openings 602A, 602B, and 602C that expose portions of electrically conductive layer 591. The remaining portions of the photoresist layer serve as a masking structure 598. The exposed portions of electrically conductive layer 591 are etched to form electrical interconnects 604, 606, and 608. For example, if electrically conductive layer 591 is aluminum. Etching electrically conductive layer 591 forms openings therethrough that are extensions of openings 602A, 602B, and 602C and that expose portions of dielectric layer 592.

Figure 47:
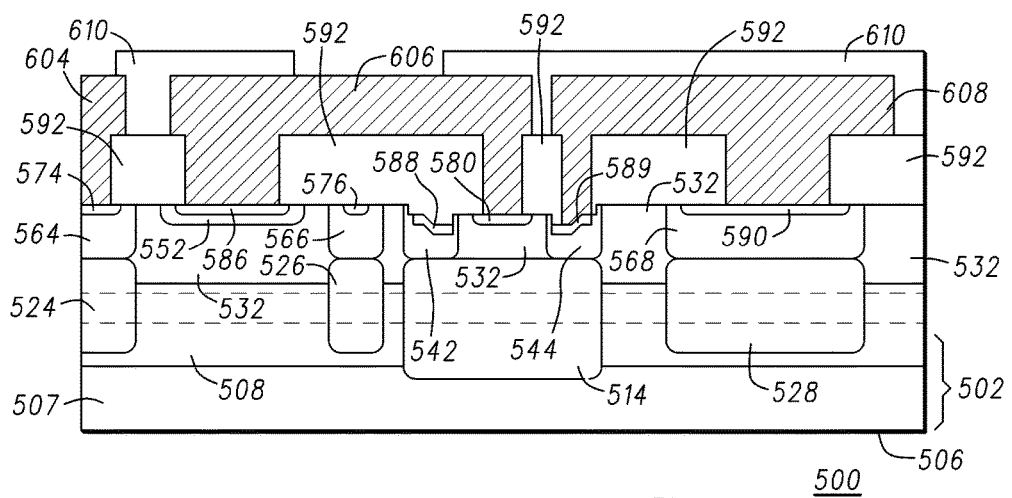
FIG. 47 is a cross-sectional view of the semiconductor component of FIG. 46 at a later stage of manufacture.

Referring now to FIG. 47, masking structure 598 is removed and a passivation layer 610 is formed on portions of electrical interconnects 604, 606, and 608 and on the portions of dielectric layer 592 exposed by openings 602A, 602B, and 602C.

Figure 48:
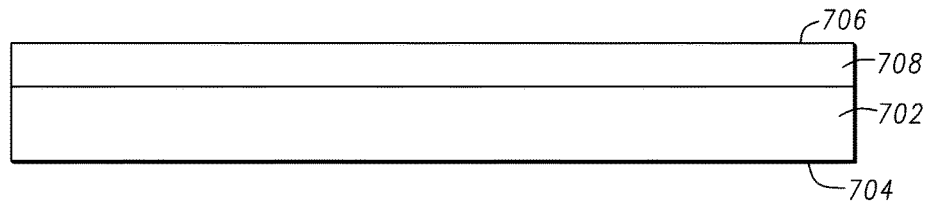
FIG. 48 is a cross-sectional view of a portion of a semiconductor component at an early stage of manufacture in accordance with another embodiment of the present invention.

FIG. 48 is a cross-sectional view of a portion of a semiconductor component 700 in accordance with an embodiment of the present invention. What is shown in FIG. 48 is a semiconductor material 702 having major surfaces 704 and 706, wherein the semiconductor material is silicon doped with an impurity material of P-type conductivity such as, for example, boron. By way of example, the resistivity of semiconductor material 702 ranges from about 0.001 Ω-cm to about 10,000 Ω-cm. Although semiconductor material 702 may be a high resistivity substrate, the resistivity or dopant concentration of semiconductor material 702 is not a limitation. Likewise, semiconductor material 702 is not limited to being silicon and its conductivity type is not limited to being P-type conductivity. It should be understood that an impurity material may be referred to as a dopant or impurity species. Other suitable materials for semiconductor material 702 include polysilicon, germanium, silicon germanium, Semiconductor-On-Insulator ("SOI") material, an epitaxial layer formed on a bulk silicon material, and the like. In addition, semiconductor material 702 can be comprised of a compound semiconductor material such as, for example, Group III-V semiconductor materials, Group II-VI semiconductor materials, or the like.

An impurity material of P-type conductivity is implanted into semiconductor material 702 to form a doped region or layer 708. Doped region 708 extends from surface 706 into semiconductor material 702. By way of example, the impurity is boron.

Figure 49:
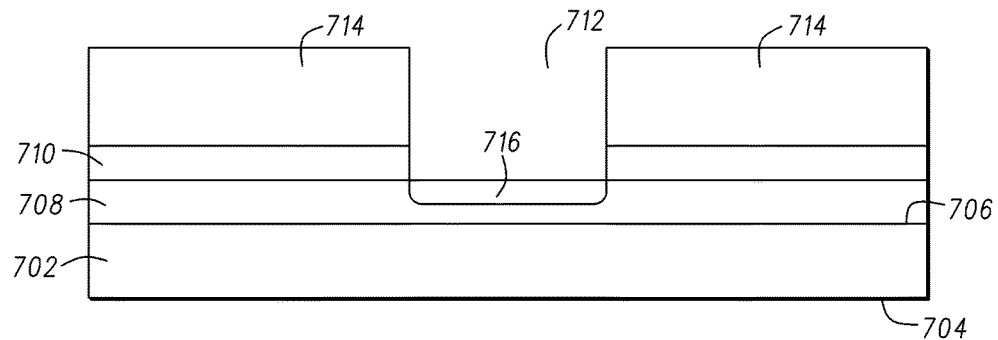
FIG. 49 is a cross-sectional view of the semiconductor component of FIG. 48 at a later stage of manufacture.

Referring now to FIG. 49, a layer of dielectric material 710 having a thickness ranging from about 1,000 Å to about 60,000 Å is formed on or from surface 706. In accordance with an embodiment, dielectric material 710 is formed by the decomposition of TEOS to form an oxide layer having a thickness of about 8,000 Å. The type of material for dielectric layer 710 is not a limitation of the present invention. A layer of photoresist is formed on TEOS layer 710 and patterned to have at least one opening 712 that exposes a portion of TEOS layer 710. The remaining portions of the photoresist layer serve as a masking structure 714.

The exposed portion of TEOS layer 710 is removed or etched using, for example, an anisotropic reactive ion etch to expose a portion of doped region 708. An impurity material of N-type conductivity is implanted into the exposed portion of doped region 708 to form a doped region 716. By way of example, the impurity material or dopant is phosphorus.

Figure 50:
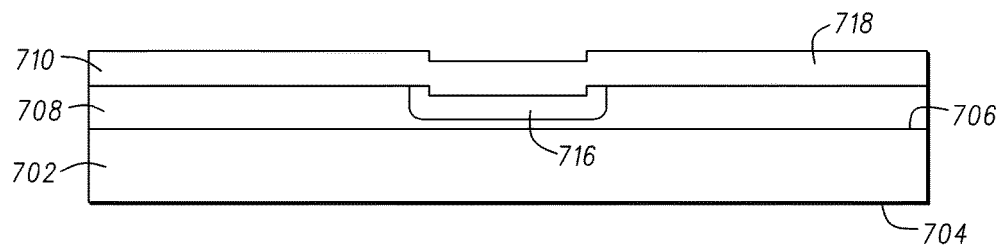
FIG. 50 is a cross-sectional view of the semiconductor component of FIG. 49 at a later stage of manufacture.

Referring now to FIG. 50, masking structure 714 and dielectric layer 710 are removed or stripped away from semiconductor material 702. A layer of dielectric material 718 is formed on or from semiconductor material 702 and doped region 716. In accordance with an embodiment, dielectric material 718 is oxide doped with an impurity material of P-type conductivity. The type of material for dielectric layer 718 is not a limitation of the present invention.

Figure 51:
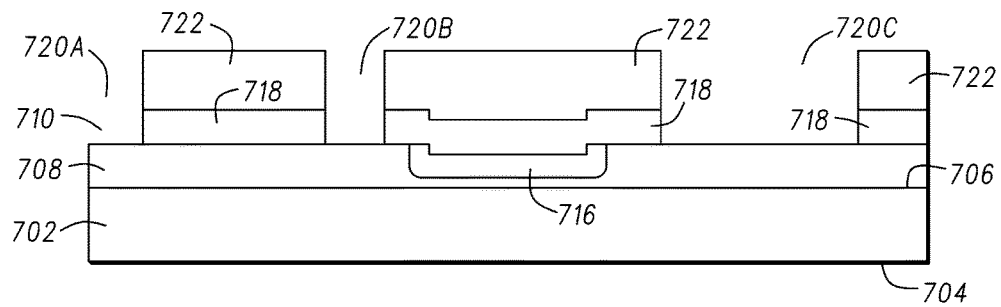
FIG. 51 is a cross-sectional view of the semiconductor component of FIG. 50 at a later stage of manufacture.

Referring now to FIG. 51, a layer of photoresist is formed on oxide layer 718 and patterned to have openings 720A, 720B, and 720C that expose portions of oxide layer 718. The remaining portions of the photoresist layer serve as a masking structure 722. Openings are formed in the exposed portions of oxide layer 718 using, for example, an anisotropic reactive ion etch. The openings expose portions of doped region 708.

Figure 52:
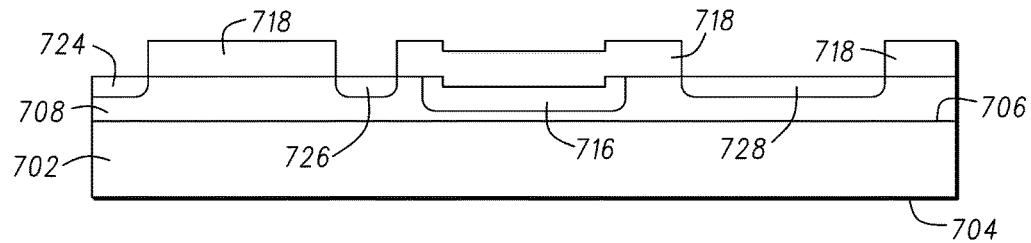
FIG. 52 is a cross-sectional view of the semiconductor component of FIG. 51 at a later stage of manufacture.

Referring now to FIG. 52, an impurity material of P-type conductivity is implanted into the exposed portions of semiconductor material 702 to form doped regions 724, 726, and 728. By way of example, the impurity material or dopant is boron.

The impurity materials of doped regions 716, 724, 726, and 728 are driven into doped region 708 using a diffusion furnace. The ambient within the furnace initially may be steam or oxygen which may be subsequently changed to a nitrogen ambient. Driving in the impurity material of doped regions 716, 724, 726, and 728 diffuses the impurity laterally and vertically so that doped regions 716, 724, 726, and 728 extend further into semiconductor material 302 than when it was initially deposited. For the sake of clarity, reference characters 716, 724, 726, and 728 are used to indicate the doped regions before and after diffusion.

Figure 53:
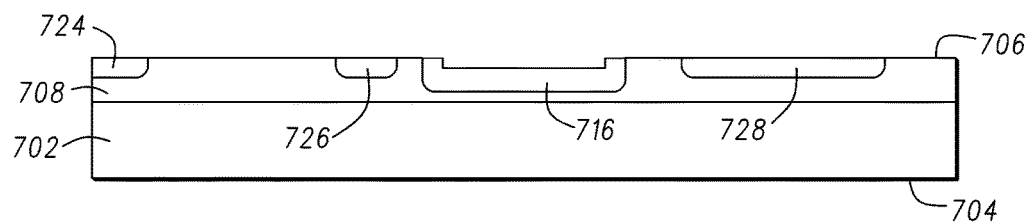
FIG. 53 is a cross-sectional view of the semiconductor component of FIG. 52 at a later stage of manufacture.

Referring now to FIG. 53, oxide layer 718 is removed or stripped from semiconductor material 702.

Figure 54:
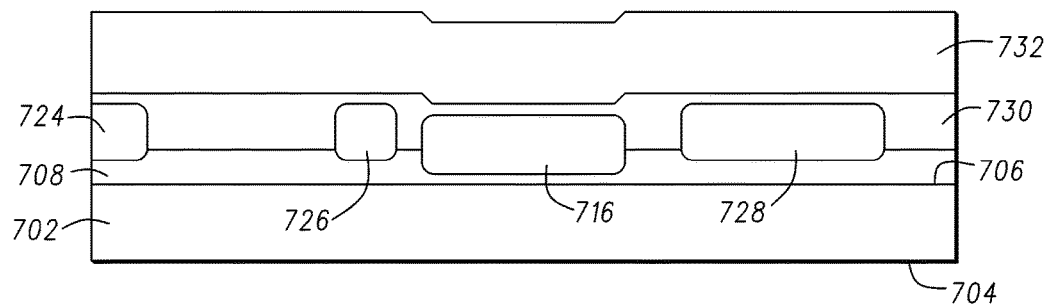
FIG. 54 is a cross-sectional view of the semiconductor component of FIG. 53 at a later stage of manufacture.

Referring now to FIG. 54, an epitaxial layer 730 having a thickness ranging from about 2 μm to about 6 μm and a resistivity ranging from about 4 Ω-cm to about 12 Ω-cm is formed on doped layer 708 in semiconductor material 702 and on doped regions 716, 724, 726, and 728. Subsequent to the formation of epitaxial layer 730, an epitaxial layer 732 having a thickness ranging from about 5 μm to about 12 μm and a resistivity ranging from about 50 Ω-cm to about 100 Ω-cm is formed on epitaxial layer 730. It should be noted that during the formation of epitaxial layers 730 and 732, doped regions 716, 724, 726, and 728 diffuse into epitaxial layer 730 and into doped region 708. As those skilled in the art are aware, the impurity materials of doped regions 716, 724, 726, and 728 diffuse in all directions, i.e., laterally and vertically; however, doped regions 716, 724, 726, and 728 do not diffuse an appreciable distance into doped region 708 compared to the distance they diffuse into epitaxial layer 730 because the concentration gradients of the impurity materials between doped regions 716, 724, 726, and 728 and epitaxial layer 730 are much greater than they are between doped regions 716, 724, 726, and 728 and doped region 708.

Figure 55:
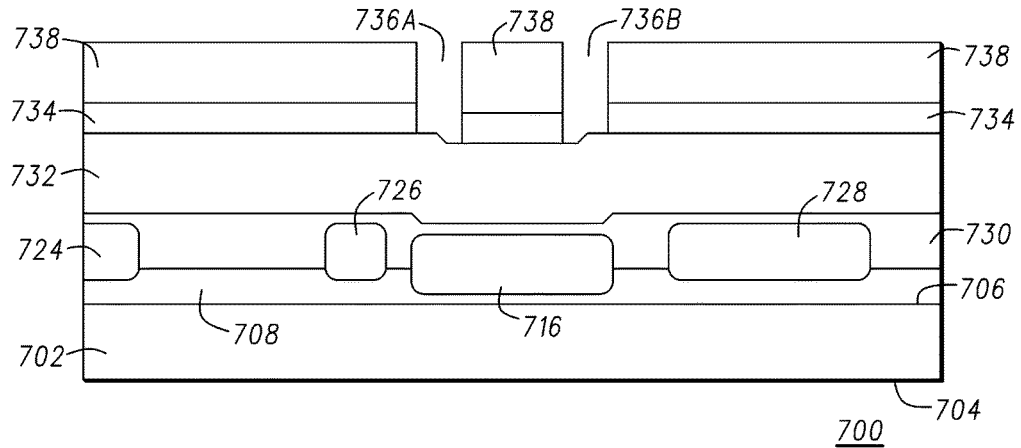
FIG. 55 is a cross-sectional view of the semiconductor component of FIG. 54 at a later stage of manufacture.

Referring now to FIG. 55, a layer of dielectric material 734 is formed on or from epitaxial layer 732. In accordance with an embodiment, dielectric material 734 is oxide formed by the decomposition of TEOS to form an oxide layer. The type of material for dielectric layer 734 is not a limitation of the present invention. A layer of photoresist is formed on TEOS layer 734 and patterned to have openings 736A and 736B that expose portions of TEOS layer 734. The remaining portions of the photoresist layer serve as a masking structure 738. Openings are formed in the exposed portions of TEOS layer 734 using, for example, an anisotropic reactive ion etch. The openings expose portions of epitaxial layer 732.

Figure 56:
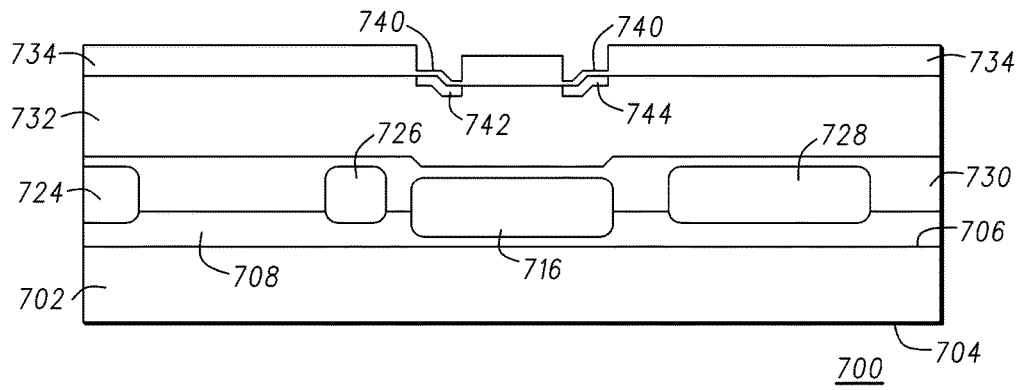
FIG. 56 is a cross-sectional view of the semiconductor component of FIG. 55 at a later stage of manufacture.

Referring now to FIG. 56, masking structure 738 is removed and screen oxide layers 740 are formed on the exposed portions of epitaxial layer 732. Formation of screen oxide layers 740 also increases the thickness of TEOS layer 734, however the increase is very small compared to the thickness of TEOS layer 734. Therefore, the change in thickness of TEOS layer 734 is not shown in FIG. 56. An impurity material of N-type conductivity is implanted through screen oxide layers 740 into epitaxial layer 732 to form doped regions 742 and 744. Those skilled in the art will appreciate that the impurity material is also implanted into TEOS layer 734. By way of example, the impurity material is phosphorus.

Figure 57:
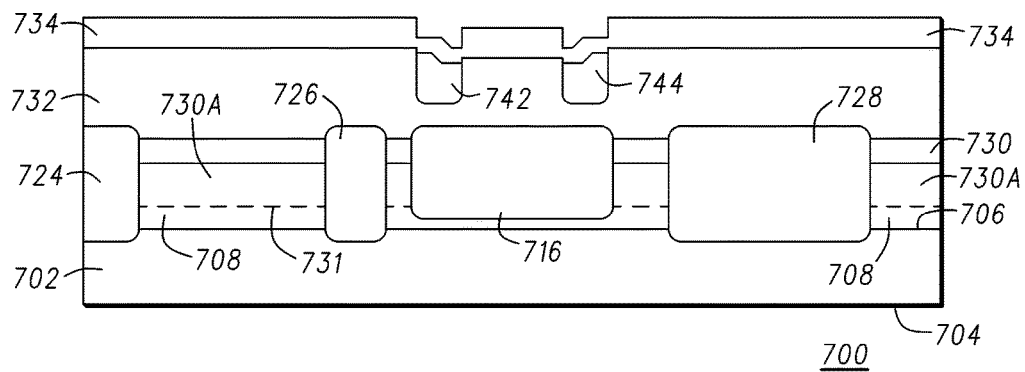
FIG. 57 is a cross-sectional view of the semiconductor component of FIG. 56 at a later stage of manufacture.

Referring now to FIG. 57, semiconductor component 700 undergoes a drive-in step that drives the impurity material of doped regions 742 and 744 into epitaxial layer 732. In addition, the drive-in step drives the P-type material of doped regions 724, 726, and 728 and the N-type impurity material of doped region 716 into epitaxial layer 732. The drive-in step also drives the impurity material of doped region 708 into a portion of doped region 730 compensating the impurity material of this region so that it has a P-type conductivity. The compensated region is identified by reference character 730A, where broken line 731 indicates the pre-diffusion interface between doped region 508 and epitaxial layer 730. The drive-in step drives the impurity materials of doped regions 724, 726, and 728 through doped region 708 and into silicon substrate 702. The impurity material of doped region 716 is also driven further into doped region 708. By way of example, the drive-in step is performed using a diffusion furnace. The ambient within the furnace may be steam or oxygen, which increases the thicknesses of oxide layers 734 and 740. For the sake of clarity, reference characters 716, 724, 726, 728, 742, and 744 are used to indicate the doped regions before and after diffusion.

Figure 58:
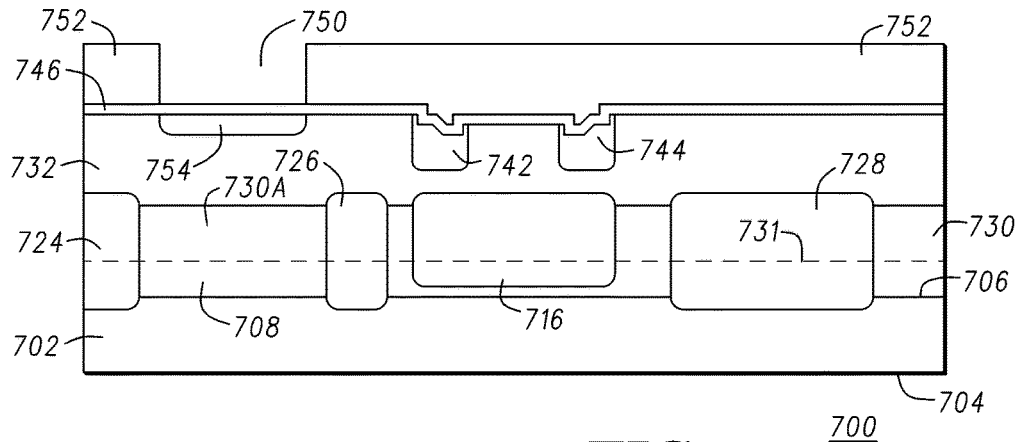
FIG. 58 is a cross-sectional view of the semiconductor component of FIG. 57 at a later stage of manufacture.

Referring now to FIG. 58, TEOS layer 734 and screen oxide layer 740 are stripped from semiconductor component 700. A screen oxide layer 746 is formed on or from epitaxial layer 732 and doped regions 742 and 744. A layer of photoresist is formed on screen oxide layer 746 and patterned to have at least one opening 750 that exposes a portion of screen oxide layer 746. The remaining portions of the photoresist layer serve as a masking structure 752. An impurity material of N-type conductivity is implanted through screen oxide layer 746 into epitaxial layer 732 to form a doped region 754. By way of example, the impurity material is phosphorus.

Figure 59:
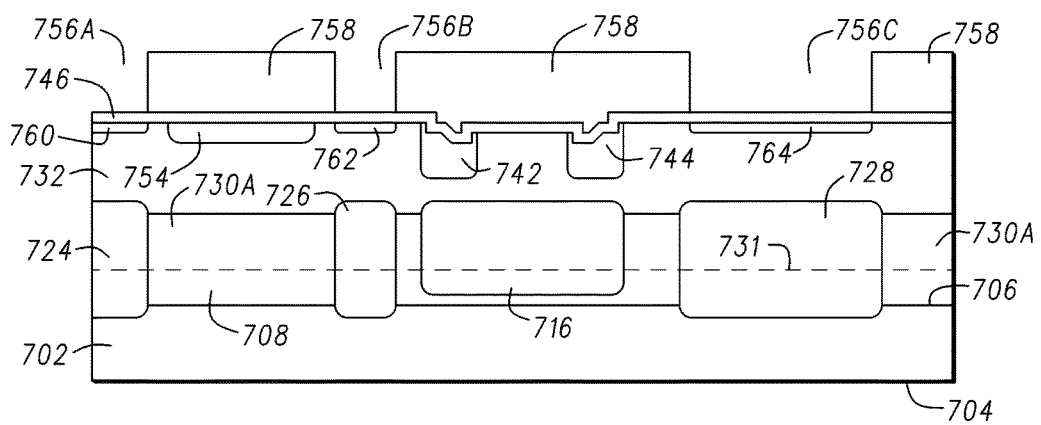
FIG. 59 is a cross-sectional view of the semiconductor component of FIG. 58 at a later stage of manufacture.

Referring now to FIG. 59, masking structure 752 is removed and semiconductor component 700 undergoes a drive-in step that drives the impurity material of doped region 754 into epitaxial layer 732. In addition, the drive-in step drives the impurity materials of doped regions 716, 724, 726, 728, and 754 further into epitaxial layer 732. The impurity material of doped regions 724, 726, and 728 is also driven further into semiconductor material 702. By way of example, the drive-in step is performed using a diffusion furnace. The ambient within the furnace may be steam or oxygen, which increases the thickness of screen oxide layer 746. As discussed above, reference characters 716, 724, 726, 728, 742, 744, and 754 are used to indicate the doped regions before and after diffusion.

A layer of photoresist is formed on screen oxide layer 746 and patterned to have openings 756A, 756B, and 756C that expose portions of screen oxide layer 746. The remaining portions of the photoresist layer serve as a masking structure 758. An impurity material of P-type conductivity is implanted through the portions of screen oxide layer 746 that are unprotected by masking structure 758 and into epitaxial layer 732 to form doped regions 760, 762, and 764. By way of example, the impurity material is boron.

Figure 60:
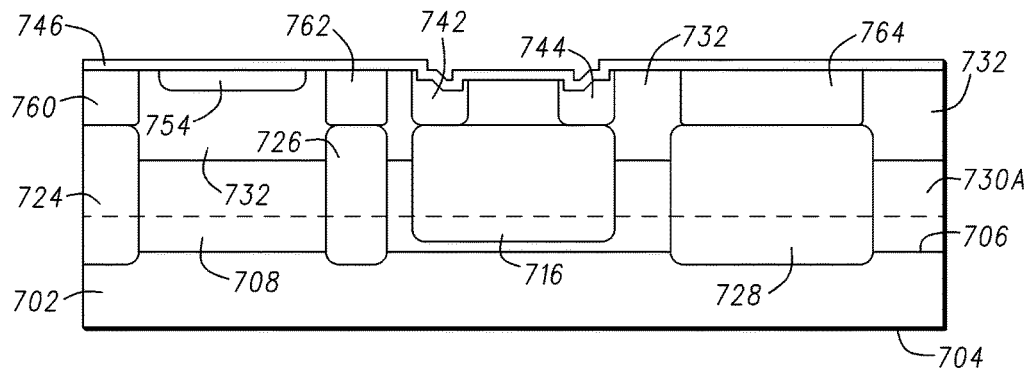
FIG. 60 is a cross-sectional view of the semiconductor component of FIG. 59 at a later stage of manufacture.

Referring now to FIG. 60, masking structure 758 is removed and semiconductor component 700 undergoes a drive-in step that drives the impurity material of doped regions 760, 762, and 764 into epitaxial layer 732. More particularly, the drive-in step drives the impurity materials of doped regions 724 and 760 so that they merge together, the impurity materials of doped regions 726 and 762 so that they merge together, the impurity materials of doped regions 728 and 764 so that they merge together, the impurity materials of doped regions 716 and 742 so that they merge together, and the impurity materials of doped regions 716 and 744 so that they merge together. By way of example, the drive-in step is performed using a diffusion furnace. The ambient within the furnace may be steam or oxygen, which increases the thickness of screen oxide layer 746.

Figure 61:
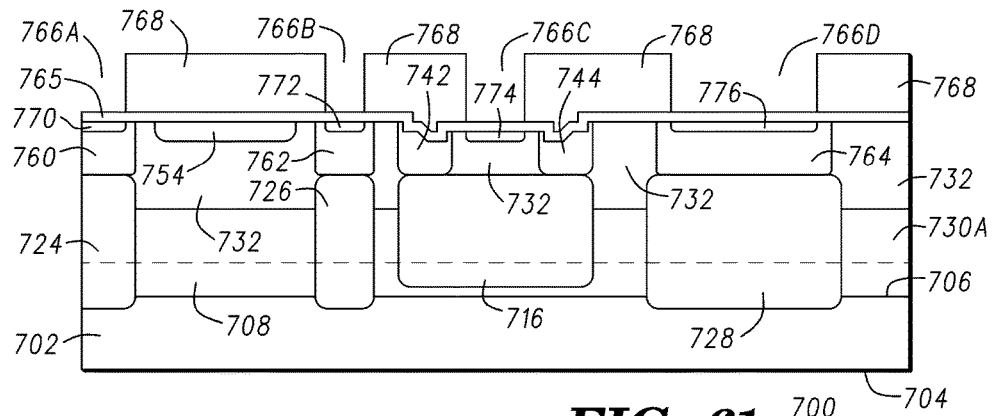
FIG. 61 is a cross-sectional view of the semiconductor component of FIG. 60 at a later stage of manufacture.

Referring now to FIG. 61, screen oxide layer 746 is stripped from semiconductor component 700. A screen oxide layer 765 is formed on or from epitaxial layer 732 and doped regions 760, 754, 762, 742, 744, and 764.

A layer of photoresist is formed on screen oxide layer 765 and patterned to have openings 766A, 766B, 766C, and 766D that expose portions of screen oxide layer 765. The remaining portions of the photoresist layer serve as a masking structure 768. An impurity material of P-type conductivity is implanted through the portions of screen oxide layer 765 unprotected by masking structure 768 and into doped regions 760, 762, and 764 to form doped regions 770, 772, and 776, respectively. The impurity of P-type conductivity is also implanted into the portion of epitaxial layer 732 unprotected by masking structure 768 to form doped region 774. By way of example, the impurity material is boron.

Figure 62:
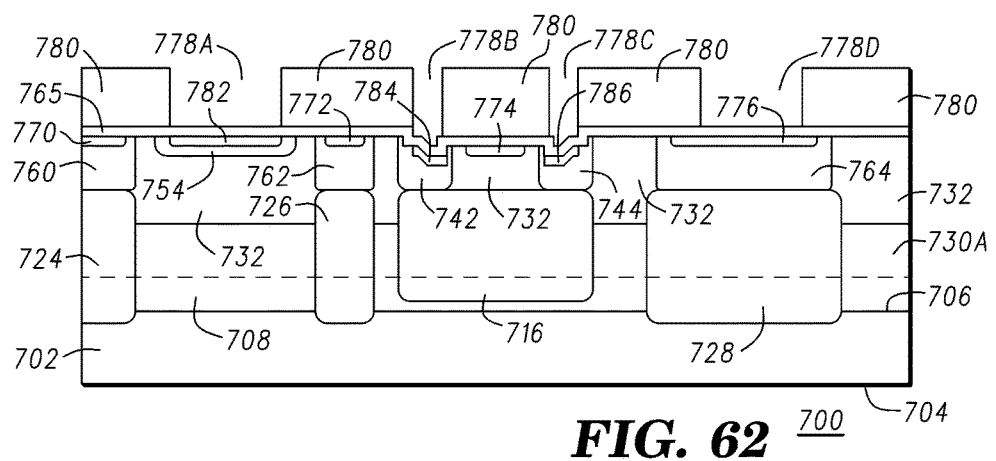
FIG. 62 is a cross-sectional view of the semiconductor component of FIG. 61 at a later stage of manufacture.

Referring now to FIG. 62, masking structure 768 is removed and a layer of photoresist is formed on screen oxide layer 765 and patterned to have openings 778A, 778B, 778C, and 778D that expose portions of screen oxide layer 765. The remaining portions of the photoresist layer serve as a masking structure 780. An impurity material of N-type conductivity is implanted through the portions of screen oxide layer 765 unprotected by masking structure 780 and into doped regions 754, 742, 744 to form doped regions 782, 784, and 786, respectively. The impurity material is also implanted into the portion of doped region 776 that is unprotected by masking structure 780. By way of example, the impurity material is boron.

Figure 63:
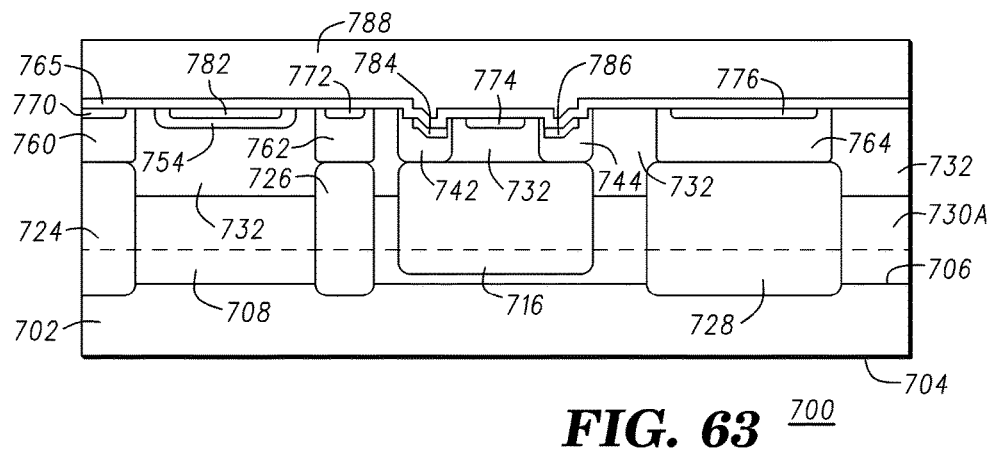
FIG. 63 is a cross-sectional view of the semiconductor component of FIG. 62 at a later stage of manufacture.

Referring now to FIG. 63, masking structure 780 is removed and a layer of dielectric material 788 is formed on screen oxide layer 765. Suitable materials for dielectric layer 788 include undoped silicate glass (USG), spin on glass (SOG), phospho silicate glass (PSG), boro-phospho silicate glass (BPSG), flowable oxide (FOX), tetraethyl ortho silicate (TEOS), plasma enhanced-TEOS (PE-TEOS), fluoro-silicate glass (FSG), Tonen silazene (TOSZ), high density plasma-chemical vapor deposition (HDP-CVD) oxide, or the like.

Figure 64:
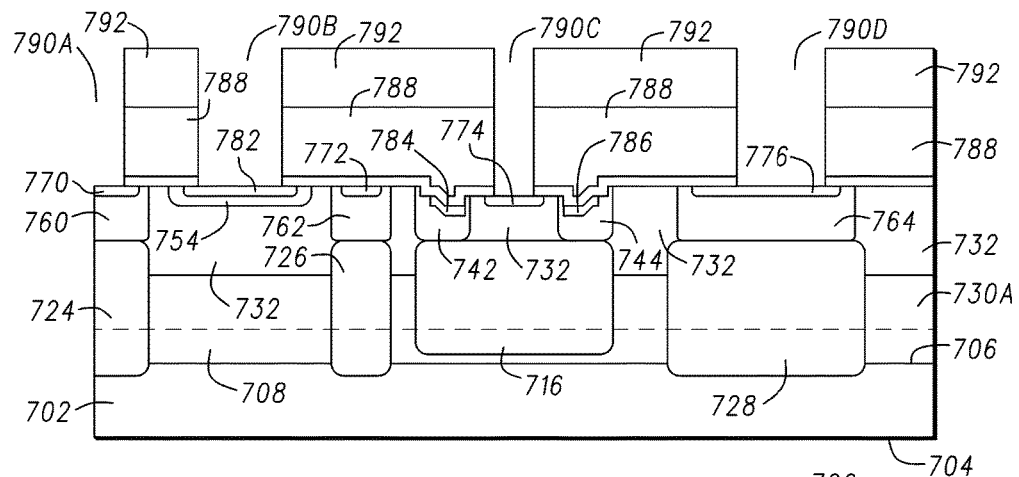
FIG. 64 is a cross-sectional view of the semiconductor component of FIG. 63 at a later stage of manufacture.

Referring now to FIG. 64, a layer of photoresist is formed on dielectric layer 788 and patterned to have openings 790A, 790B, 790C, and 790D that expose portions of dielectric layer 788. The remaining portions of the photoresist layer serve as a masking structure 792. Openings are formed in the exposed portions of dielectric layer 788 using, for example, an anisotropic reactive ion etch. The openings expose portions of doped regions 770, 782, 774, and 776.

Figure 65:
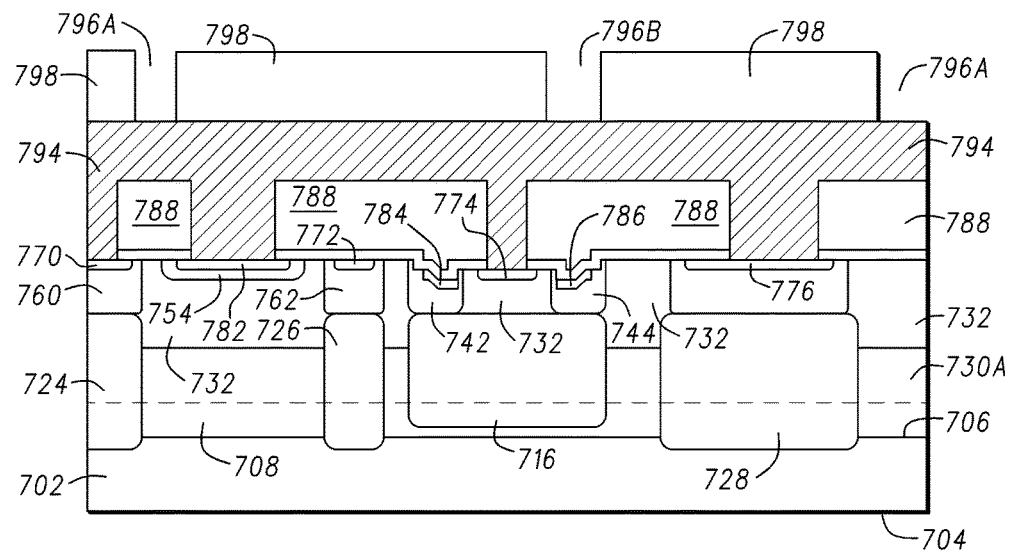
FIG. 65 is a cross-sectional view of the semiconductor component of FIG. 64 at a later stage of manufacture.

Referring now to FIG. 65, masking structure 792 is removed. A layer of electrically conductive material 794 is formed on dielectric layer 788 and in contact with doped regions 770, 782, 774, and 776 that were exposed by etching dielectric layer 788. By way of example, electrically conductive layer 794 is aluminum that is deposited using a sputter deposition process. A layer of photoresist is formed on the electrically conductive layer and patterned to have openings 796A, 796B, and 796C that expose portions of electrically conductive layer 794. The remaining portions of the photoresist layer serve as a masking structure 798.

Figure 66:
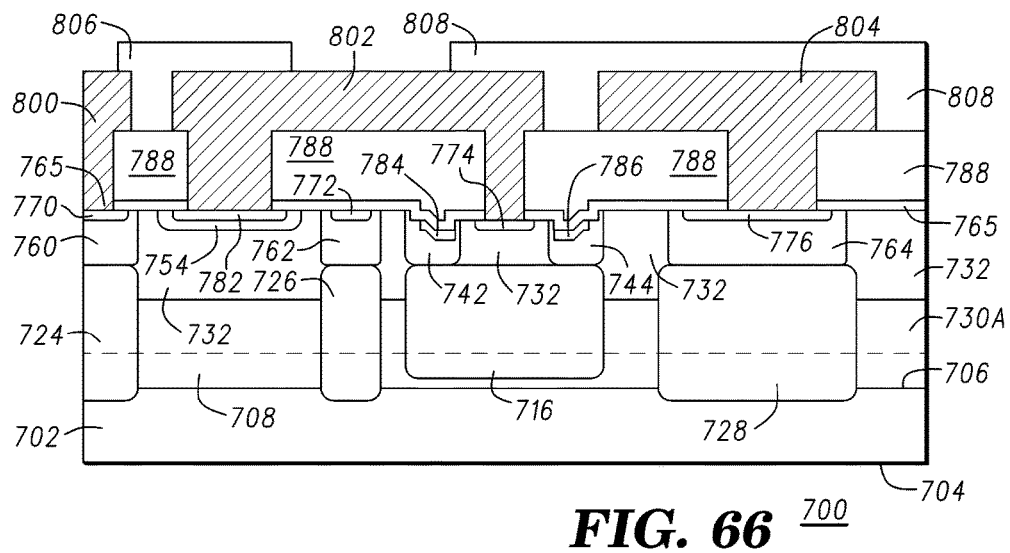
FIG. 66 is a cross-sectional view of the semiconductor component of FIG. 65 at a later stage of manufacture.

Referring now to FIG. 66, the exposed portions of the electrically conductive layer 794 are etched to form electrical interconnects 800, 802, and 804. Etching electrically conductive material 794 forms openings in the electrically conductive material that are extensions of openings 796A, 796B, and 796C (shown in FIG. 65) and that expose portions of dielectric layer 788. Masking structure 798 is removed.

A passivation layer is formed on electrical interconnects 800, 802, and 804 and on the exposed portions of dielectric layer 788. The passivation layer is etched to form passivation structures 806 and 808. Alternatively, the passivation layer is not etched, but remains over electrical interconnects 800, 802, and 804 and on the exposed portions of dielectric layer 788.

Figure 67:
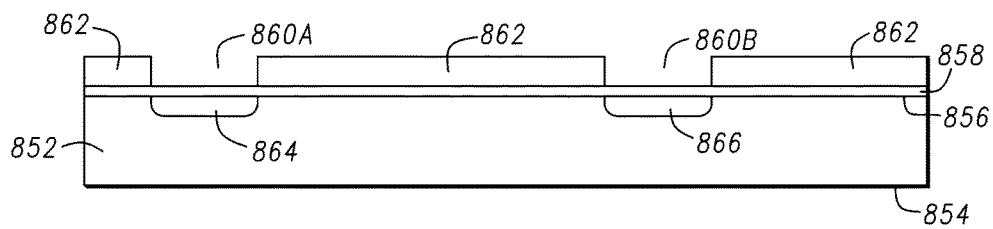
FIG. 67 is a cross-sectional view of a portion of a semiconductor component at an early stage of manufacture in accordance with another embodiment of the present invention.

FIG. 67 is a cross-sectional view of a semiconductor component 850 in accordance with another embodiment of the present invention. What is shown in FIG. 67 is a semiconductor material 852 having major surfaces 854 and 856. In accordance with an embodiment, semiconductor material 852 is silicon doped with an impurity material of P-type conductivity such as, for example, boron. By way of example, the resistivity of semiconductor material 852 ranges from about 0.001 Ω-cm to about 10,000 Ω-cm. Although semiconductor material 852 may be a high resistivity substrate, the resistivity or dopant concentration of semiconductor material 852 is not a limitation of the present invention. Likewise, semiconductor material 852 is not limited to being silicon and its conductivity type is not limited to being P-type conductivity. It should be understood that an impurity material is also referred to as a dopant or impurity species. Other suitable materials for semiconductor material 852 include polysilicon, germanium, silicon germanium, Semiconductor-On-Insulator ("SOI") material, an epitaxial layer formed on a bulk silicon material, or the like. In addition, semiconductor material 852 can be comprised of a compound semiconductor material such as, for example, Group III-V semiconductor materials, Group II-VI semiconductor materials, or the like.

A layer of dielectric material 858 having a thickness ranging from about 1,000 Å to about 10,000 Å is formed on or from surface 856. In accordance with an embodiment, dielectric material 858 is formed by the decomposition of TEOS to form an oxide layer having a thickness of about 2,000 Å. The type of material for dielectric layer 858 is not a limitation of the present invention. A layer of photoresist is formed on TEOS layer 858 and patterned to have openings 860A and 860B that expose portions of TEOS layer 858. The remaining portions of the photoresist layer serve as a masking structure 862.

An impurity material of P-type conductivity is implanted into the portions of semiconductor material 852 unprotected by masking structure 862 to form doped regions 864 and 866. By way of example, the impurity material is boron.

Figure 68:
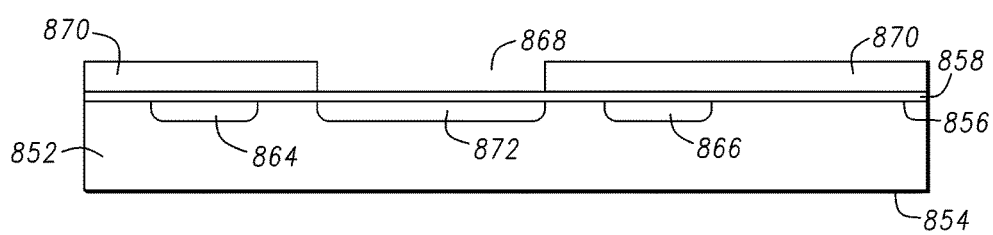
FIG. 68 is a cross-sectional view of the semiconductor component of FIG. 67 at a later stage of manufacture.

Referring now to FIG. 68, masking structure 862 is removed and a layer of photoresist is formed on TEOS layer 858 and patterned to have an opening 868 that exposes a portion of TEOS layer 858. The remaining portions of the photoresist layer serve as a masking structure 870. An impurity material of N-type conductivity is implanted into the portion of semiconductor material 852 unprotected by masking structure 870 to form a doped region 872. By way of example, the impurity is boron.

Figure 69:
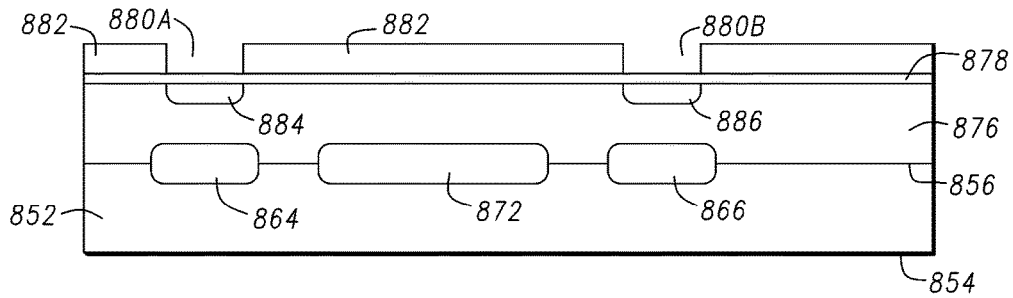
FIG. 69 is a cross-sectional view of the semiconductor component of FIG. 68 at a later stage of manufacture.

Referring now to FIG. 69, masking structure 870 and dielectric layer 858 are removed. An epitaxial layer 876 having a thickness ranging from about 2 μm to about 6 μm and a resistivity ranging from about 4 Ω-cm to about 12 Ω-cm is formed on semiconductor material 852 and doped regions 864, 866, and 872. It should be noted that during the formation of epitaxial layer 876, doped regions 864, 866, and 872 diffuse into epitaxial layer 876 and into semiconductor material 852. As those skilled in the art are aware, the impurity materials of doped regions 864, 866, and 872 diffuse in all directions, i.e., laterally and vertically.

A layer of dielectric material 878 having a thickness ranging from about 1,000 Å to about 10,000 Å is formed on or from epitaxial layer 876. In accordance with an embodiment, dielectric material 878 is formed by the decomposition of TEOS to form an oxide layer having a thickness of about 2,000 Å. The type of material for dielectric layer 878 is not a limitation of the present invention. A layer of photoresist is formed on TEOS layer 878 and patterned to have openings 880A and 880B that expose portions of TEOS layer 878. The remaining portions of the photoresist layer serve as a masking structure 882.

An impurity material of P-type conductivity is implanted into the portions of epitaxial layer 876 unprotected by masking structure 882 to form doped regions 884 and 886. By way of example, the impurity is boron.

Figure 70:
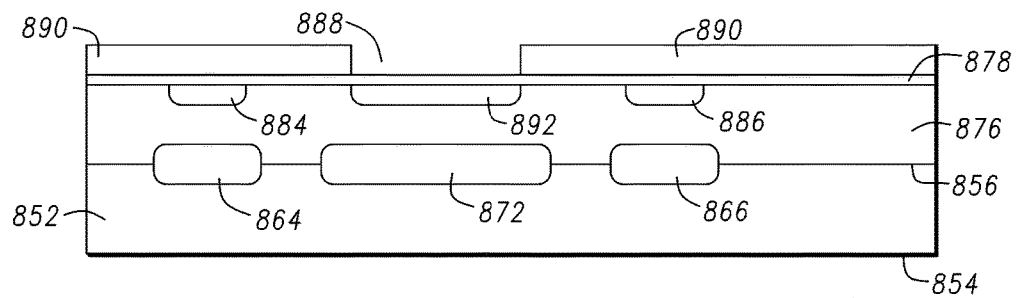
FIG. 70 is a cross-sectional view of the semiconductor component of FIG. 69 at a later stage of manufacture.

Referring now to FIG. 70, masking structure 882 is removed and a layer of photoresist is formed on TEOS layer 878 and patterned to have an opening 888 that exposes a portion of TEOS layer 878. The remaining portions of the photoresist layer serve as a masking structure 890. An impurity material of N-type conductivity is implanted into the portion of epitaxial layer 876 unprotected by masking structure 890 to form a doped region 892. By way of example, the impurity is phosphorus.

Figure 71:
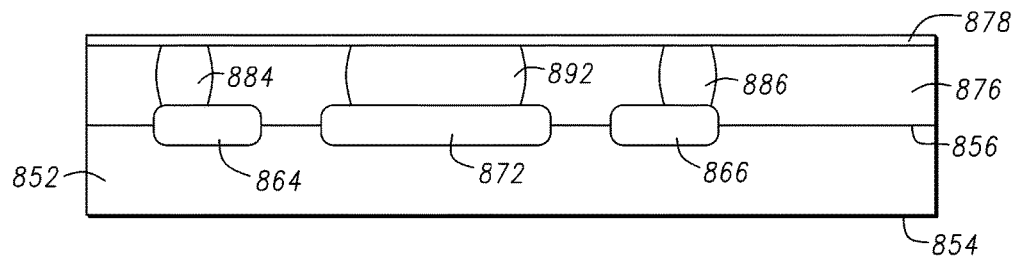
FIG. 71 is a cross-sectional view of the semiconductor component of FIG. 70 at a later stage of manufacture.

Referring now to FIG. 71, masking structure 890 is removed and the impurity material of doped regions 884, 886, and 892 are driven into epitaxial layer 876 using a diffusion furnace. The ambient within the furnace initially may be steam or oxygen and subsequently changed to a nitrogen ambient. Driving in the impurity material of doped regions 884, 886, and 892 diffuses the impurity materials or dopants laterally and vertically so that doped region 884 extends to doped region 864, doped region 886 extends to doped region 866, and doped region 892 extends to doped region 872. In addition, the drive-in step increases the thickness of dielectric layer 878. For the sake of clarity, reference characters 884, 886, and 892 are used to indicate the doped regions before and after diffusion.

Figure 72:
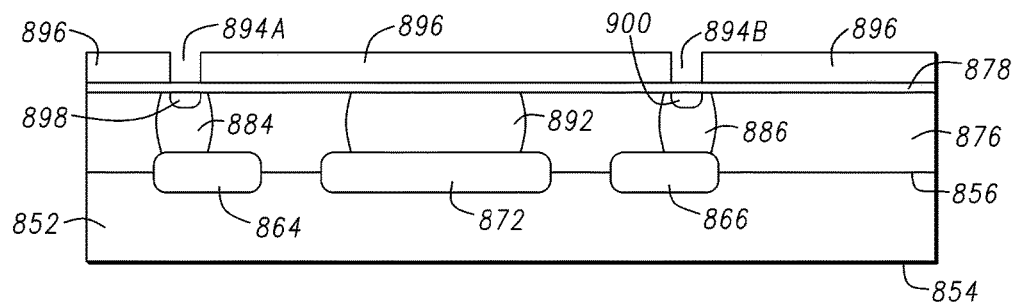
FIG. 72 is a cross-sectional view of the semiconductor component of FIG. 71 at a later stage of manufacture.

Referring now to FIG. 72, a layer of photoresist is formed on dielectric layer 878 and patterned to have openings 894A and 894B that expose portions of dielectric layer 878. The remaining portions of the photoresist layer serve as a masking structure 896. An impurity material of P-type conductivity is implanted into the portions of epitaxial layer 876 unprotected by masking structure 896 to form doped regions 898 and 900. Doped region 898 is in the portion of epitaxial layer 876 containing doped region 884 and doped region 900 is in the portion of epitaxial layer 876 containing doped region 886. By way of example, the impurity material is boron.

Figure 73:
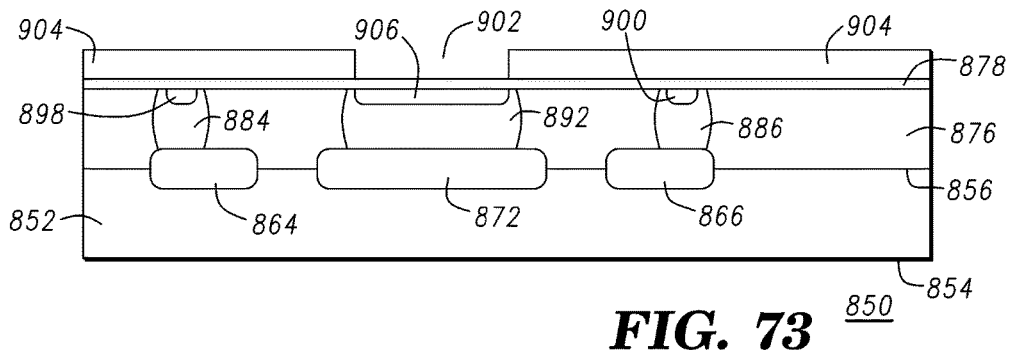
FIG. 73 is a cross-sectional view of the semiconductor component of FIG. 72 at a later stage of manufacture.

Referring now to FIG. 73, masking structure 896 is removed and a layer of photoresist is formed on dielectric layer 878 and patterned to have an opening 902 that exposes a portion of dielectric layer 878. The remaining portions of the photoresist layer serve as a masking structure 904. An impurity material of N-type conductivity is implanted into the portion of epitaxial layer 876 unprotected by masking structure 904 to form a doped region 906. Doped region 906 is in the portion of epitaxial layer 876 containing doped region 892. By way of example, the impurity material is phosphorus.

Figure 74:
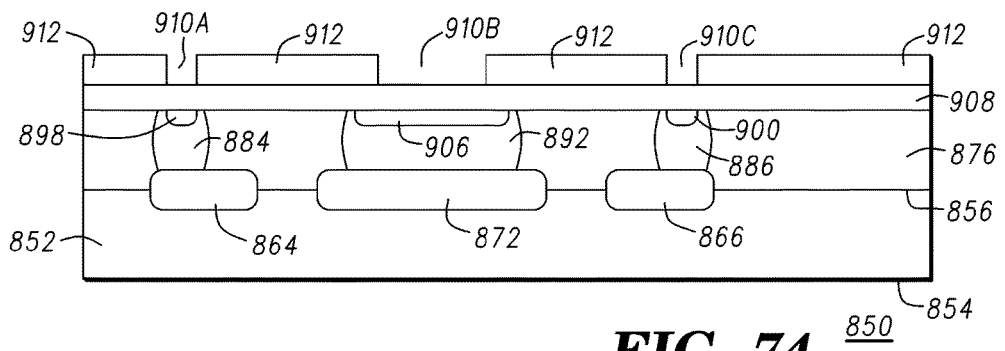
FIG. 74 is a cross-sectional view of the semiconductor component of FIG. 73 at a later stage of manufacture.

Referring now to FIG. 74, masking structure 904 and dielectric layer 878 are stripped or removed. A layer of dielectric material 908 having a thickness ranging from about 1,000 Å to about 60,000 Å is formed on or from epitaxial layer 876. In accordance with an embodiment, dielectric layer 908 is formed by the decomposition of TEOS to form an oxide layer having a thickness of about 8,000 Å. The type of material for dielectric layer 908 is not a limitation of the present invention. A layer of photoresist is formed on TEOS layer 908 and patterned to have openings 910A, 910B, and 910C that expose portions of TEOS layer 908. The remaining portions of the photoresist layer serve as a masking structure 912.

Figure 75:
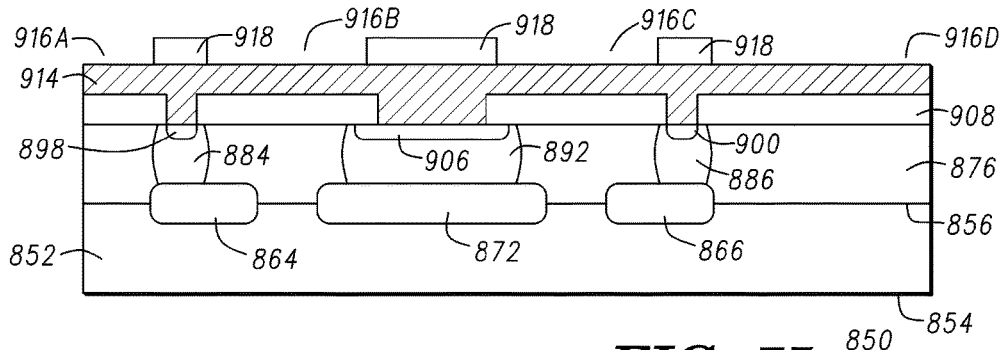
FIG. 75 is a cross-sectional view of the semiconductor component of FIG. 74 at a later stage of manufacture.

Referring now to FIG. 75, the portions of dielectric layer 908 exposed by openings 910A, 910B, and 910C are removed using, for example, an anisotropic etch that exposes doped regions 898, 900, and 906. Masking structure 912 is removed. A layer of electrically conductive material 914 is formed on dielectric layer 788 and in contact with doped regions 898, 900, and 906 that were exposed by etching dielectric layer 908. By way of example, electrically conductive layer 914 is aluminum that is deposited using a sputter deposition process. A layer of photoresist is formed on the electrically conductive layer and patterned to have openings 916A, 916B, 916C, and 916D that expose portions of electrically conductive layer 914. The remaining portions of the photoresist layer serve as a masking structure 918.

Figure 76:
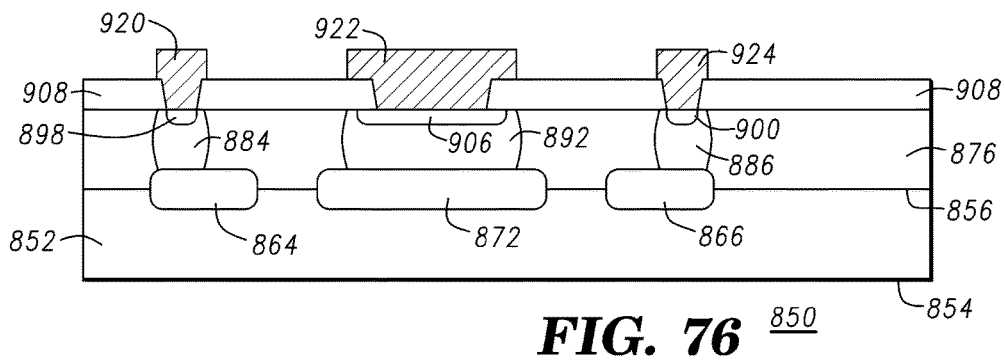
FIG. 76 is a cross-sectional view of the semiconductor component of FIG. 75 at a later stage of manufacture.

Referring now to FIG. 76, the portions of electrically conductive layer 914 unprotected by masking structure 918 are etched using for example, an anisotropic reactive ion etch to expose portions of dielectric layer 908 and leave electrical conductors 920, 922, and 924.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:
    providing a semiconductor material having first and second doped regions, the first doped region of a first conductivity type and the second doped region of a second conductivity type; and
    forming at least a first electrically conductive structure that serves as a first array element of an array of radial elements, a second electrically conductive structure that serves as a second array element of the array of radial elements, and a third electrically conductive structure that serves as a third array element of the array of radial elements, each of the first, second, and third array elements along different radii of the array of radial elements, wherein the first, second, and third electrically conductive structures each have first and second ends, the first ends proximal to the first doped region and the second ends distal from the first doped region and over a portion of the second doped region, and wherein a distance between the second ends of the first and second electrically conductive structures is substantially the same as a distance between the second ends of the second and third electrically conductive structures.

2. The method of claim 1, wherein forming the at least first, second, and third electrical conductors in the array of radial elements includes forming the conductors in an array pattern selected from the group of array patterns comprising circular, elliptical, and rectangular.

3. The method of claim 1, wherein forming the at least first, second, and third electrically conductive structures as the array of radial elements includes arranging the array of radial elements in an array pattern of a quarter circle.

4. The method of claim 1, further including forming the at least first, second, and third electrically conductive structures to electrically contact the first and second doped regions.

5. The method of claim 4, further including:
    providing the semiconductor material having first and second major surfaces, wherein the semiconductor material comprises a substrate having a first epitaxial layer formed thereon;
    forming an electrically conductive material in contact with the second major surface of the semiconductor material;
    configuring the first doped region and the first portion of the first epitaxial layer as a first diode, wherein the first doped region serves as an anode of the first diode and the first portion of the first epitaxial layer serves as a cathode of the first diode; and
    configuring the second doped region and the second portion of the first epitaxial layer as a second diode, wherein the second doped region and the second portion of the first epitaxial layer serve as a cathode of a second diode and the electrically conductive material in contact with the second major surface of the semiconductor material serve as an anode of the second diode.

6. A method for manufacturing a semiconductor component, comprising:
    providing a semiconductor material having first and second opposing surfaces;

isolating a first portion of the semiconductor material of a first conductivity type from a second portion of the semiconductor material;

forming a first doped region of a second conductivity type in the first portion of the semiconductor material of the first conductivity type; and forming at least a first electrically conductive structure that serves as a first array element of an array of radial elements, a second electrically conductive structure that serves as a second array element of the array of radial elements, and a third electrically conductive structure that serves as a third array element of the array of radial elements, each of the first, second, and third array elements along different radii of the array of radial elements, wherein the first, second, and third electrically conductive structures each have first and second ends, the first ends proximal to the first doped region and the second ends distal from the first doped region and over a portion of the second doped region, and wherein a distance between the second ends of the first and second electrically conductive structures is substantially the same as a distance between the second ends of the second and third electrically conductive structures.

* * * * *